US010763371B2

(12) United States Patent
Morosawa et al.

(10) Patent No.: US 10,763,371 B2
(45) Date of Patent: Sep. 1, 2020

(54) THIN-FILM TRANSISTOR, METHOD OF MANUFACTURING THE SAME, AND DISPLAY DEVICE

(71) Applicant: Joled Inc., Tokyo (JP)

(72) Inventors: Narihiro Morosawa, Kanagawa (JP); Yoshihiro Oshima, Kanagawa (JP)

(73) Assignee: Joled Inc., Tokyo (JP)

(*) Notice: Subject to any disclaimer, the term of this patent is extended or adjusted under 35 U.S.C. 154(b) by 0 days.

(21) Appl. No.: 15/813,735

(22) Filed: Nov. 15, 2017

(65) Prior Publication Data
US 2018/0076330 A1 Mar. 15, 2018

Related U.S. Application Data

(62) Division of application No. 13/053,997, filed on Mar. 22, 2011, now Pat. No. 9,859,437.

(30) Foreign Application Priority Data

Mar. 30, 2010 (JP) ................ 2010-079293
Nov. 1, 2010 (JP) ................ 2010-245035

(51) Int. Cl.
H01L 29/66 (2006.01)
H01L 29/786 (2006.01)
H01L 29/417 (2006.01)

(52) U.S. Cl.
CPC .... *H01L 29/7869* (2013.01); *H01L 29/41733* (2013.01); *H01L 29/66969* (2013.01); *H01L 29/78618* (2013.01)

(58) Field of Classification Search
USPC ........................................ 257/57
See application file for complete search history.

(56) References Cited

U.S. PATENT DOCUMENTS 3,084,300 A 4/1963 Sanchez
5,079,476 A 1/1992 Kane
(Continued)

FOREIGN PATENT DOCUMENTS

JP 02-256248 10/1990
JP 09-045925 2/1997
(Continued)

OTHER PUBLICATIONS

J. Park, et al., "Self-Aligned Top-Gate Amorphous Gallium Indium Zinc Oxide Think Film Transistors", Applied Physics Letters, American Institute of Physics, 2008, vol. 93, 053501.
(Continued)

*Primary Examiner* — Hrayr A Sayadian
(74) *Attorney, Agent, or Firm* — K&L Gates LLP

(57) ABSTRACT

A thin film transistor is provided. The thin film transistor includes an oxide semiconductor layer including a source region, a drain region, and a channel region wherein a portion of the source and drain regions has an oxygen concentration less than the channel region. Further provided is a thin film transistor that includes an oxide semiconductor layer including a source region, a drain region, and a channel region, wherein a portion of the source and drain regions includes a dopant selected from the group consisting of aluminum, boron, gallium, indium, titanium, silicon, germanium, tin, lead, and combinations thereof.

12 Claims, 31 Drawing Sheets

(56) References Cited

U.S. PATENT DOCUMENTS

| | | | |
|---|---|---|---|
| 2003/0218221 A1 | 11/2003 | Wagner et al. | |
| 2006/0079057 A1 | 4/2006 | Cho | |
| 2006/0094168 A1 | 5/2006 | Hoffman | |
| 2007/0241327 A1 | 10/2007 | Kim et al. | |
| 2008/0197350 A1 | 8/2008 | Park et al. | |
| 2009/0242881 A1* | 10/2009 | Yoon | H01L 27/1225 257/43 |
| 2010/0025678 A1 | 2/2010 | Yamazaki | |
| 2010/0038641 A1 | 2/2010 | Imai | |
| 2010/0051949 A1* | 3/2010 | Yamazaki | H01L 29/4908 257/57 |
| 2010/0224873 A1 | 9/2010 | Sakata | |
| 2010/0295042 A1 | 11/2010 | Yano et al. | |
| 2011/0147738 A1 | 6/2011 | Yamazaki et al. | |
| 2011/0315936 A1* | 12/2011 | Inoue | C23C 14/086 252/512 |

FOREIGN PATENT DOCUMENTS

| | | |
|---|---|---|
| JP | 2006-502597 | 1/2006 |
| JP | 2007-220817 | 8/2007 |
| JP | 2007-220818 | 8/2007 |
| JP | 2007-284342 | 11/2007 |
| JP | 2008-205469 | 9/2008 |
| JP | 2009-010362 | 1/2009 |
| JP | 2009-147192 | 7/2009 |
| JP | 2009-206437 | 9/2009 |
| JP | 2009-278115 | 11/2009 |
| JP | 2010-056437 | 3/2010 |
| JP | 2010-277272 | 12/2010 |
| JP | 2011-119718 | 6/2011 |
| WO | 2008/114588 | 9/2008 |
| WO | 2008/149873 | 12/2008 |
| WO | 2009/093625 | 7/2009 |

OTHER PUBLICATIONS

R. Hayashi, et al., "Improved Amorphous In—Ga—Zn—O TFTs", SID 08 Digest, 2008, 42.1, pp. 621-624.

Japanese Office Action dated Sep. 25, 2014 in corresponding Japanese Application No. 2010245035.

* cited by examiner

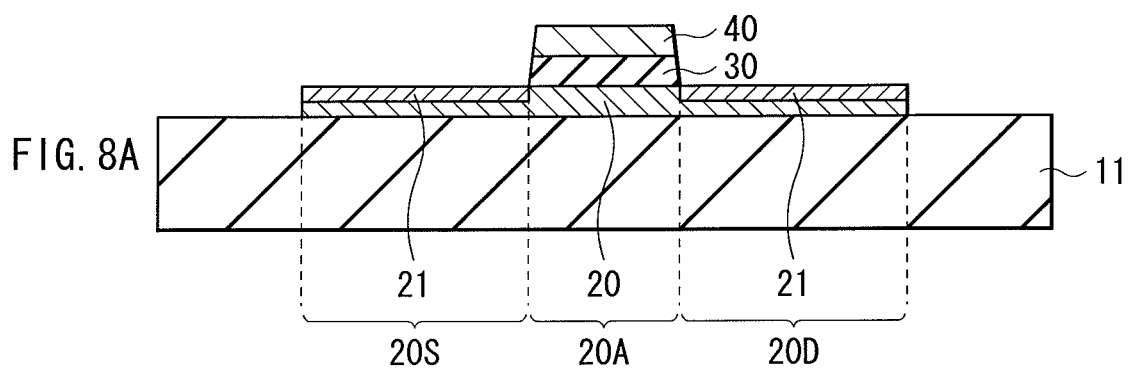
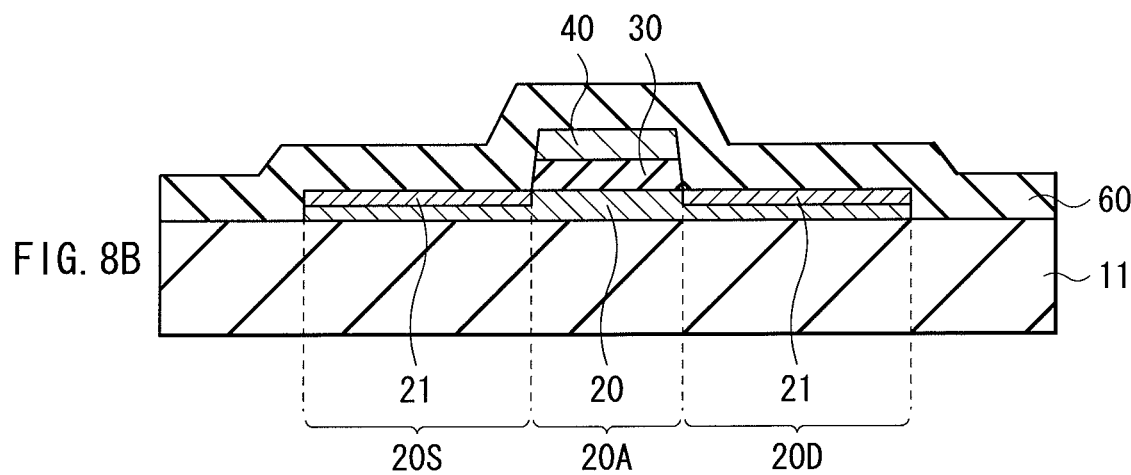
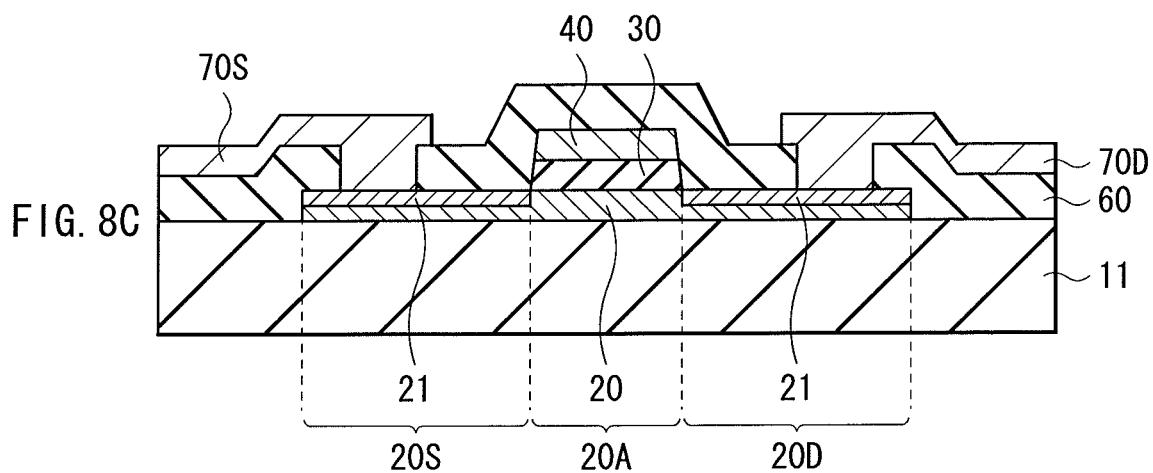

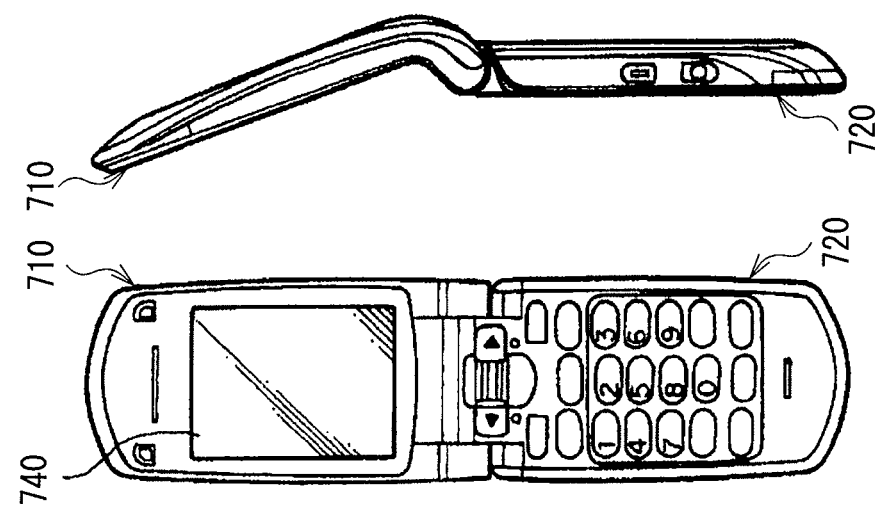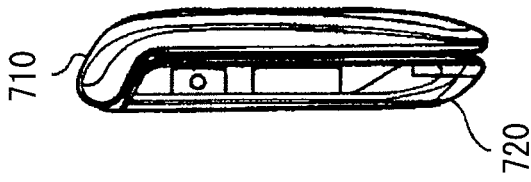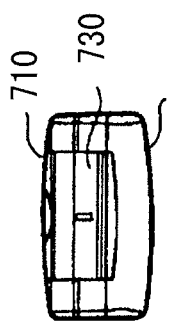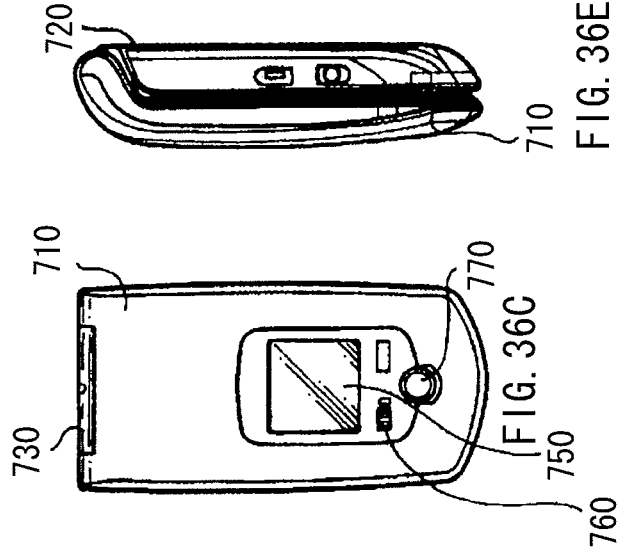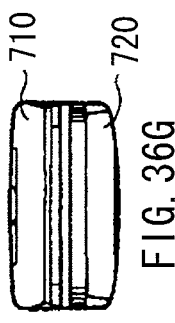

THIN-FILM TRANSISTOR, METHOD OF MANUFACTURING THE SAME, AND DISPLAY DEVICE

CROSS REFERENCES TO RELATED APPLICATIONS

The present application is a divisional application of U.S. patent application Ser. No. 13/053,997, filed on Mar. 22, 2011, which application claims priority to Japanese Priority Patent Application Nos. JP 2010-079293 and JP 2010-245035 filed in the Japan Patent Office on Mar. 30, 2010 and Nov. 1, 2010, respectively, the entire contents of which are hereby incorporated by reference.

BACKGROUND

The present application relates to a thin-film transistor using an oxide semiconductor, to a method of manufacturing the same, and to a display device provided with the thin-film transistor.

An active-driving-type liquid crystal display device and an active-driving-type organic electroluminescence (hereinafter simply referred to as "EL") display device each use a thin-film transistor (TFT) as a drive element, and each cause an electric charge, which corresponds to a signal voltage for writing an image, to be held in a hold capacitor. However, when a parasitic capacitance generated in a cross region of a gate electrode and a source electrode, or of the gate electrode and a drain electrode of the thin-film transistor is large, the signal voltage may fluctuate, leading to an occurrence of image degradation.

In the organic EL display device, in particular, it is necessary to increase the hold capacitor when the parasitic capacitance is large, and a proportion of wiring etc. occupying a pixel layout is large. As a result, there is more chance of short-circuit between the wirings etc., and there rises an issue that a fabrication yield is decreased.

To address these disadvantages, an attempt has been made to reduce the parasitic capacitance formed in the cross region of the gate electrode and the source electrode or the drain electrode, in the thin-film transistor in which an oxide semiconductor such as zinc oxide (ZnO) and indium gallium zinc oxide (IGZO) is used for a channel.

For example, Japanese Unexamined Patent Application Publication No. 2007-220817 (JP2007-220817A) and J. Park et al. "Self-aligned top-gate amorphous gallium indium zinc oxide thin film transistors", Applied Physics Letters, American Institute of Physics, 93, 053501 (2008) (Non-Patent Document 1) each disclose a self-aligned top-gate thin-film transistor. In each of the disclosed thin-film transistors, a gate electrode and a gate insulating film are formed to have the same shape on a channel region of an oxide semiconductor thin-film layer, and a region of the oxide semiconductor thin-film layer uncovered by the gate electrode and the gate insulating film is then made low in resistance to form a source-drain region. Also, R. Hayashi et al. "Improved Amorphous In—Ga—Zn—O TFTs", SID 08 DIGEST, 42. 1, 621-624 (2008) (Non-Patent Document 2) discloses a bottom-gate thin-film transistor having a self-aligned structure, which forms a source region and a drain region in an oxide semiconductor film with a back-side exposure in which a gate electrode is utilized as a mask.

SUMMARY

Techniques disclosed in JP2007-220817A and the Non-Patent Document 2 each form a silicon nitride film serving as an interlayer insulating film with a plasma chemical vapor deposition (CVD) method, and each introduce hydrogen included in the silicon nitride film into an oxide semiconductor thin-film layer, to form a low-resistance source-drain region in a self-aligned fashion. The technique disclosed in JP2007-220817A further uses a plasma process utilizing hydrogen gas in combination with the introduction of hydrogen from the silicon nitride film. Also, a technique disclosed in the Non-Patent Document 1 exposes an oxide semiconductor film under a plasma atmosphere utilizing argon gas to form a low-resistance source-drain region. Existing techniques including those disclosed in JP2007-220817A and Non-Patent Documents 1 and 2 each have a drawback, in that an element characteristic depends on a plasma process step having a large number of varying factors, and thus it is difficult to apply those techniques to mass production stably.

It is desirable to provide a thin-film transistor, a method of manufacturing the same, and a display device provided with the thin-film transistor, capable of stabilizing a characteristic of a thin-film transistor having a self-aligned structure.

In the thin-film transistor according to this embodiment, at least a part of each of the source region and the drain region extending in the depth direction from the upper face of each of the source region and the drain region is provided with the low-resistance region, which includes, as a dopant, one or more elements selected from the group consisting of aluminum, boron, gallium, indium, titanium, silicon, germanium, tin, and lead. Hence, an element characteristic is stabilized.

In the thin-film transistor according to this embodiment, at least a part of each of the source region and the drain region extending in the depth direction from the upper face of each of the source region and the drain region is provided with the low-resistance region, which includes the oxygen concentration which is lower than the oxygen concentration of the channel region. Hence, an element characteristic is stabilized.

In an embodiment, a thin film transistor is provided. The thin film transistor includes an oxide semiconductor layer including a source region, a drain region, and a channel region wherein a portion of the source and drain regions has an oxygen concentration less than the channel region.

In an embodiment, the portion of the source and drain regions is a low-resistance region extending in a depth direction from an upper face thereof.

In an embodiment, the low-resistance region extends within 10 nm in the depth direction from the upper face thereof.

In an embodiment, a high-resistance material layer is provided that is formed on at least the portion of the source and drain regions.

In an embodiment, the high-resistance material layer is selected from the group consisting of titanium oxide, aluminum oxide, and indium oxide.

In an embodiment, the high-resistance material layer includes a plurality of island-shaped metal films.

In an embodiment, the island-shaped metal films are spaced apart so as to provide a clearance gap.

In an embodiment, the portion of the source and drain regions is a low-resistance region extending in a depth direction from an upper face thereof, and wherein a first portion of the island-shaped metal films is in contact with the low resistance region and a second portion of the island-shaped metal films is in contact with a gate electrode.

In an embodiment, the thin film transistor further includes an insulating layer.

In an embodiment, the thin film transistor further includes a source electrode and a drain electrode.

In an embodiment, the thin film transistor is configured as any one of a top gate structure and a bottom gate structure.

In an embodiment, a thin film transistor is provided. The thin film transistor includes an oxide semiconductor layer including a source region, a drain region, and a channel region, wherein a portion of the source and drain regions includes a dopant selected from the group consisting of aluminum, boron, gallium, indium, titanium, silicon, germanium, tin, lead, and combinations thereof.

In an embodiment, the portion of the source and drain regions is a low-resistance region extending in a depth direction from an upper face thereof.

In an embodiment, the low-resistance region extends at least within 30 nm in the depth direction from the upper face thereof.

In an embodiment, the thin film transistor further includes a high-resistance material layer that is formed on at least the portion of the source and drain regions.

In an embodiment, the high-resistance material layer includes a constituent selected from the group consisting of titanium, aluminum, and indium, boron, gallium, silicon, germanium, tin, and lead.

In an embodiment, the high-resistance material layer includes any one of a plurality of island-shaped metal films and a plurality of island-shaped nonmetal films.

In an embodiment, any one of the island-shaped metal films and the island-shaped nonmetal films are spaced apart so as to provide a clearance gap.

In an embodiment, the portion of the source and drain regions is a low-resistance region extending in a depth direction from an upper face thereof, and wherein a first portion of any one of the island-shaped metal films and the island-shaped nonmetal films is in contact with the low resistance region and a second portion of any one of the island-shaped metal films and the island-shaped nonmetal films is in contact with a gate electrode.

In an embodiment, the thin film transistor further includes an insulating layer.

In an embodiment, the thin film transistor further includes a source electrode and a drain electrode.

In an embodiment, the thin film transistor is configured as any one of a top gate structure and a bottom gate structure.

In an embodiment, a method of manufacturing a thin film transistor is provided. The method includes forming an oxide semiconductor layer including a source region, a drain region, and a channel region, wherein a portion of the source and drain regions includes an oxygen concentration less than the channel region.

In an embodiment, the portion of the source and drain regions is a low-resistance region.

In an embodiment, the method further includes forming a metal layer; and heat treating the metal layer thereby forming the low-resistance region.

In an embodiment, the metal layer is heat treated at an annealing temperature.

In an embodiment, the method further includes removing the metal layer subsequent to heat treatment.

In an embodiment, the metal layer includes a plurality of island-shaped metal films.

In an embodiment, wherein the metal layer is formed on the source and drain regions.

In an embodiment, the method further includes forming an insulating layer.

In an embodiment, the method further includes a source electrode and a drain electrode.

In an embodiment, the thin film transistor is configured as any one of a bottom gate structure and a top gate structure.

In yet another embodiment, a method of manufacturing a thin film transistor is provided. The method including forming an oxide semiconductor layer including a source region, a drain region, and a channel region, wherein a portion of the source and drain regions includes a dopant selected from the group consisting of aluminum, boron, gallium, indium, titanium, silicon, germanium, tin, lead, and combinations thereof.

In an embodiment, the portion of the source and drain regions is a low-resistance region.

In an embodiment, the method further includes forming any one of a metal layer and a nonmetal layer; and heat treating any one of the metal layer and the nonmetal layer thereby forming the low-resistance region.

In an embodiment, the method further includes removing any one of the metal layer and the nonmetal layer subsequent to heat treatment.

In an embodiment, the metal layer includes a plurality of island-shaped metal films and the nonmetal layer includes a plurality of island-shaped nonmetal films.

In an embodiment, any one of the metal layer and the nonmetal layer is formed on the source and drain regions.

In an embodiment, the method further includes forming an insulating layer.

In an embodiment, the method further includes forming a source electrode and a drain electrode.

In an embodiment, the thin film transistor is configured as any one of a bottom gate structure and a top gate structure.

According to each of the thin-film transistors of the embodiments, the low-resistance region, which includes one or more elements selected from the group consisting of aluminum, boron, gallium, indium, titanium, silicon, germanium, tin, and lead as a dopant, or includes the oxygen concentration which is lower than the oxygen concentration of the channel region, is provided in at least a part of each of the source region and the drain region extending in the depth direction from the upper face of each of the source region and the drain region. Hence, it is possible to stabilize a characteristic of the thin-film transistor having the self-aligned structure. Therefore, when the thin-film transistor is used to configure the display device, it is possible to achieve high-quality displaying by the thin-film transistor, having the self-aligned structure in which the parasitic capacitance is reduced and having the stabilized characteristic.

According to each of the methods of manufacturing the thin-film transistor of the embodiments, the gate insulating film and the gate electrode are formed in this order and in the same shape on the channel region of the oxide semiconductor film. Then, the metal film or the nonmetal film serving as the dopant material film is formed on the oxide semiconductor film, the gate insulating film, and the gate electrode. Then, the heat treatment is performed to oxidize the metal film or the nonmetal film serving as the dopant material film into the high-resistance film, and to form the low-resistance region including, as a dopant, one or more elements selected from the group consisting of aluminum, boron, gallium, indium, titanium, silicon, germanium, tin, and lead, or including the oxygen concentration which is lower than the oxygen concentration of the channel region, in at least a part of each of the source region and the drain region extending in the depth direction from the upper face of each of the source region and the drain region. Hence, it is possible to form the low-resistance region without using a process step having a large number of varying factors such a plasma process step. Therefore, unlike existing techniques, it is possible to solve dependence of an element characteristic on the plasma process step, and to achieve a stable element characteristic.

Additional features and advantages are described herein, and will be apparent from the following Detailed Description and the figures.

BRIEF DESCRIPTION

FIGS. 8A to 8C are cross-sectional views illustrating a manufacturing method of the thin-film transistor illustrated in FIG. 7 in order of process steps.

FIG. 36A is a front view in an open state of a sixth application example, FIG. 36B is a side view in the open state, FIG. 36C is a front view in a closed state, FIG. 36D is a left side view, FIG. 36E is a right side view, FIG. 36F is a top view, and FIG. 36G is a bottom view.

DETAILED DESCRIPTION

The present application will be described in detail with reference to the accompanying drawings according to an embodiment. The description will be given in the following order.

1. First Embodiment: an embodiment of a top-gate thin-film transistor in which a low-resistance region is formed by utilizing oxidation of metal.

2. Second Embodiment: an embodiment of the top-gate thin-film transistor in which the low-resistance region is formed by utilizing dopant.

3. First Modification: a modification of the top-gate thin-film transistor in which a high-resistance film is removed.

4. Third Embodiment: an embodiment of a bottom-gate thin-film transistor in which the high-resistance film is remained.

5. Second Modification: a modification of the bottom-gate thin-film transistor in which the high-resistance film is removed.

6. Fourth Embodiment: an embodiment of the top-gate thin-film transistor in which the high-resistance film is formed in an island-like shape.

7. Third Modification: a modification of a manufacturing method in which a metal film is patterned in an island-like shape and is then oxide to form the high-resistance film.

8. Fourth Modification: a modification of the manufacturing method in which the metal film is oxide to form the high-resistance film and is then patterned in the island-like shape.

9. Fifth Embodiment: an embodiment of the bottom-gate thin-film transistor in which the high-resistance film is formed in the island-like shape.

10. Application Examples.

First Embodiment

Figure 1:
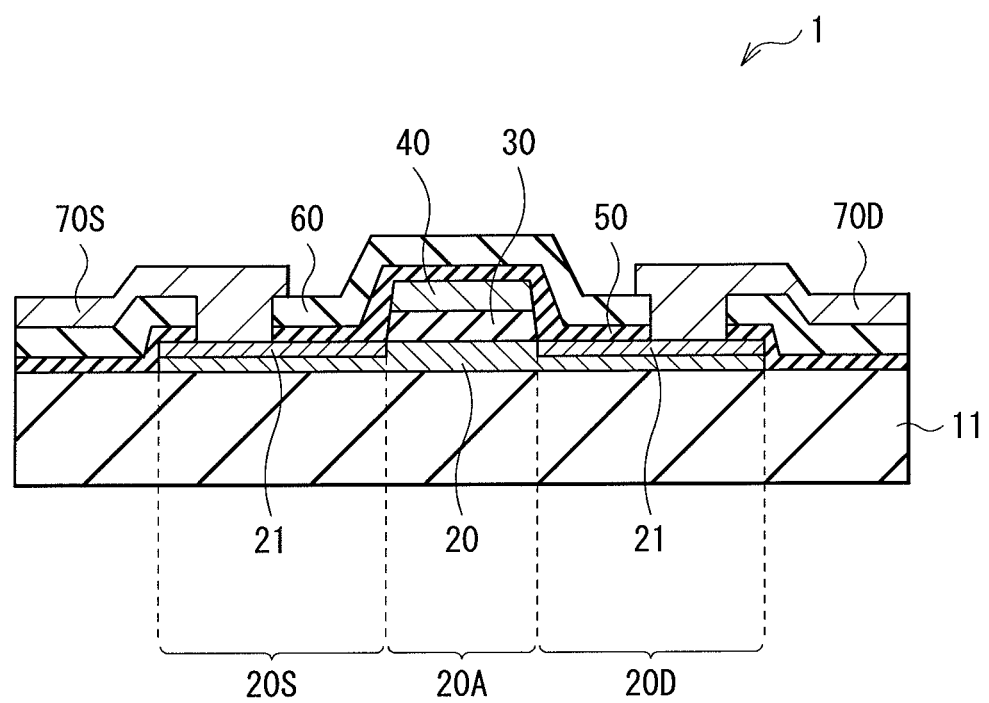
FIG. 1 is a cross-sectional view illustrating a configuration of a thin-film transistor according to a first embodiment.

FIG. 1 illustrates a cross-sectional configuration of a thin-film transistor 1 according to a first embodiment. The thin-film transistor 1 may be used as a drive element in a device such as a liquid crystal display and an organic EL display. The thin-film transistor 1 may have a top-gate structure (or a staggered structure), in which an oxide semiconductor film 20, a gate insulating film 30, a gate electrode 40, a high-resistance film 50, an interlayer insulating film 60, a source electrode 70S, and a drain electrode 70D are stacked in this order on a substrate 11, for example.

The substrate 11 may be configured by a glass substrate, a plastic film, or other suitable member, for example. A material of a plastic can be polyethylene terephthalate (PET), polyethylene naphthalate (PEN), or other suitable material. The plastic film, which is inexpensive, may be used in order to deposit the oxide semiconductor film 20 without heating the substrate 11 in a later-described sputtering process. The substrate 11 may be a metal substrate depending on an application, such as a stainless steel (SUS).

The oxide semiconductor film 20 is provided on the substrate 11 in an island-like shape including the gate electrode 40 and peripheral sections of the gate electrode 40, and functions as an active layer of the thin-film transistor 1. The oxide semiconductor film 20 may have a thickness of about 50 nm, for example, and has a channel region 20A opposed to the gate electrode 40. The gate insulating film 30 and the gate electrode 40 are provided in this order and in the same shape on the channel region 20A. A source region 20S is provided on one side of the channel region 20A, and a drain region 20D is provided on the other side of the channel region 20A.

The channel region 20A is configured by an oxide semiconductor. As used herein, the term "oxide semiconductor" refers to a compound including oxygen and one or more elements such as indium, gallium, zinc, and tin. The oxide semiconductor can be an amorphous oxide semiconductor and a crystalline oxide semiconductor. The amorphous oxide semiconductor can be indium gallium zinc oxide (IGZO). The crystalline oxide semiconductor can be zinc oxide (ZnO), indium zinc oxide (IZO; Registered Trademark), indium gallium oxide (IGO), indium tin oxide (ITO), and indium oxide (InO).

Each of the source region 20S and the drain region 20D includes a low-resistance region 21 in a partial region extending in a depth direction from an upper face thereof. The low-resistance region 21 may have an oxygen concentration which is lower than that of the channel region 20A, for example, and is thereby made low in resistance. This makes it possible for the thin-film transistor 1 to have a self-aligned structure, and to be able to stabilize its characteristics.

It is desirable that the oxygen concentration of the low-resistance region 21 be equal to or less than 30%, since a resistance increases when the oxygen concentration in the low-resistance region 21 exceeds 30%.

A region other than the low-resistance region 21 of each of the source region 20S and the drain region 20D is configured by an oxide semiconductor as with the channel region 20A. A depth of the low-resistance region 21 will be described later in detail.

The gate insulating film 30 may have a thickness of about 300 nm, for example. The gate insulating film 30 may be a monolayer film, which can be a silicon dioxide film, a silicon nitride film, a silicon nitride oxide film, an aluminum oxide film, or other suitable film, or a multilayer film thereof. In particular, the silicon dioxide film or the aluminum oxide film is preferable, in that the silicon dioxide film and the aluminum oxide film are difficult to reduce the oxide semiconductor film 20.

The gate electrode 40 serves to apply a gate voltage to the thin-film transistor 1, and to control an electron density in the oxide semiconductor film 20 with the gate voltage. The gate electrode 40 is provided in a selective region on the substrate 11. For example, the gate electrode 40 has a thickness of between 10 nm and 500 nm both inclusive, and preferably has a thickness of about 200 nm, and may be configured of molybdenum (Mo). It is preferable that a material structuring the gate electrode 40 be a metal having a low resistance, which can be aluminum (Al), copper (Cu), or other suitable metal, since the gate electrode 40 is desirably low in resistance. A multilayer film having a combination of a low-resistance layer and a barrier layer is also preferable, since this makes it possible to make the gate electrode 40 low in resistance. The low-resistance layer can be aluminum (Al), copper (Cu), or other suitable element, and the barrier layer can be titanium (Ti), molybdenum (Mo), or other suitable element.

The high-resistance film 50 is provided between the interlayer insulating film 60 and the oxide semiconductor film 20, between the interlayer insulating film 60 and the gate insulating film 30, and between the interlayer insulating film 60 and the gate electrode 40. The high-resistance film 50 is a metal film which serves as a source of supply of metal which is diffused into the low-resistance region 21, and which is oxidized, in a later-described manufacturing process. The high-resistance film 50 may be configured by titanium oxide, aluminum oxide, indium oxide, or other suitable oxide. The high-resistance film 50 made of titanium oxide, aluminum oxide, or indium oxide has an excellent barrier property against outside air, and is thus able to reduce an influence of oxygen or moisture that changes electrical characteristics of the oxide semiconductor film 20. Hence, providing of the high-resistance film 50 makes it possible to stabilize electrical characteristics of the thin-film transistor 1, and to further increase an effect achieved by the interlayer insulating film 60. A thickness of the high-resistance film 50 may be equal to or less than 20 nm, for example.

The interlayer insulating film 60 is provided on surfaces of the oxide semiconductor film 20, the gate insulating film 30, and the gate electrode 40 with the high-resistance film 50 in between. The interlayer insulating film 60 may have a thickness of about 300 nm, for example. The interlayer insulating film 60 may be configured of a monolayer film, which can be a silicon dioxide film, an aluminum oxide film, or other suitable film, or a multilayer film thereof. In particular, the multilayer film of the silicon dioxide film and the aluminum oxide film makes it possible to suppress incorporation or diffusion of moisture into the oxide semiconductor film 20, and to further increase electrical stability and reliability of the thin-film transistor 1.

The source electrode 70S and the drain electrode 70D are connected to the low-resistance region 21 through connection holes provided in the interlayer insulating film 60 and the high-resistance film 50. The source electrode 70S and the drain electrode 70D each may have a thickness of about 200 nm, and may be configured of molybdenum (Mo). As in the gate electrode 40, it is preferable that the source electrode 70S and the drain electrode 70D each be configured by a metal (or a metal wiring) having a low resistance, which can be aluminum (Al), copper (Cu), or other suitable metal. A multilayer film having a combination of a low-resistance layer and a barrier layer is also preferable. The low-resistance layer can be aluminum (Al), copper (Cu), or other suitable element, and the barrier layer can be titanium (Ti), molybdenum (Mo), or other suitable element. The use of such a multilayer film makes it possible to perform driving having reduced wiring delay.

It is desirable that each of the source electrode 70S and the drain electrode 70D be provided to evade or bypass a region immediately above the gate electrode 40, since this enables to reduce parasitic capacitances formed in a cross region of the gate electrode 40 and the source electrode 70S and in a cross region of the gate electrode 40 and the drain electrode 70D.

The thin-film transistor 1 may be manufactured, for example, as follows.

FIGS. 2A to 3C illustrate a manufacturing method of the thin-film transistor 1 in order of process steps. First, the oxide semiconductor film 20, made of the material described above, is formed at a thickness of about 50 nm on the entire surface of the substrate 11 with a sputtering method, for example. Herein, a ceramic target having the same composition as that of the oxide semiconductor film 20 to be formed is used. Also, an oxygen partial pressure is so controlled that desired transistor characteristics are obtained, since a carrier concentration in the oxide semiconductor film 20 is largely dependent on the oxygen partial pressure in sputtering.

Figure 2A:
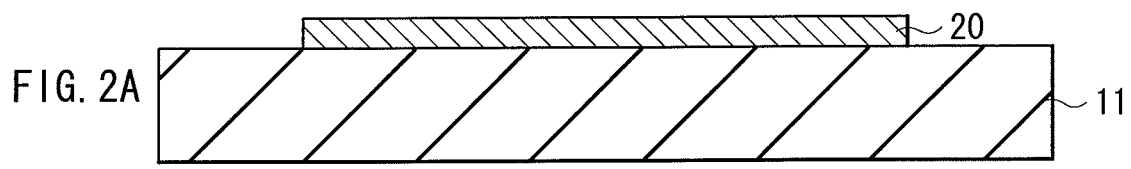
FIGS. 2A to 2C are cross-sectional views illustrating a manufacturing method of the thin-film transistor illustrated in FIG. 1 in order of process steps.

Then, as illustrated in FIG. 2A, the oxide semiconductor film 20 is shaped in the island-like shape, which includes the channel region 20A, the source region 20S on one side thereof, and the drain region 20D on the other side thereof, with photolithography and etching processes, for example. Herein, it is preferable that the oxide semiconductor film 20 be processed with a wet-etching utilizing a mixture of phosphoric acid, nitric acid, and acetic acid. The use of the mixture of phosphoric acid, nitric acid, and acetic acid makes it possible to sufficiently increase a selectivity ratio relative to an underlying substrate, and to process relatively easily.

Figure 2B:
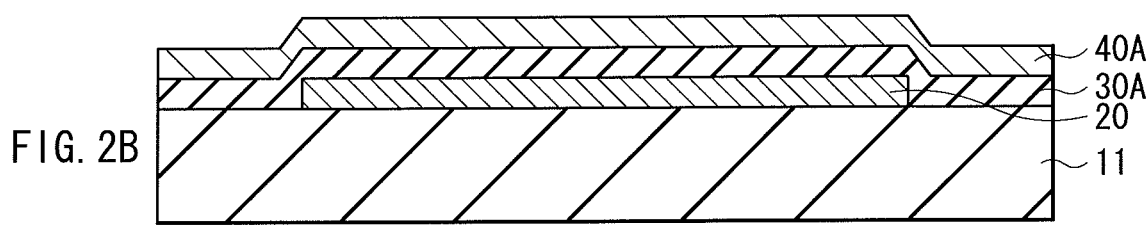

Then, as illustrated in FIG. 2B, a gate insulating material film 30A, which can be the silicon dioxide film, the aluminum oxide film, or other suitable oxide film, is formed at a thickness of about 300 nm on the entire surfaces of the substrate 11 and the oxide semiconductor film 20 with a plasma chemical vapor deposition (CVD) method etc., for example. The silicon dioxide film here may be formed with a reactive-sputtering method, other than the plasma CVD method mentioned before. The aluminum oxide film may be formed with a reactive-sputtering method, a CVD method, or an atomic layer deposition method.

Thereafter, referring again to FIG. 2B, a gate electrode material film 40A, which can be the monolayer film including molybdenum (Mo), titanium (Ti), aluminum (Al), or other suitable element, or the multilayer film thereof, is formed at a thickness of about 200 nm on the entire surface of the gate insulating material film 30A with a sputtering method, for example.

Figure 2C:
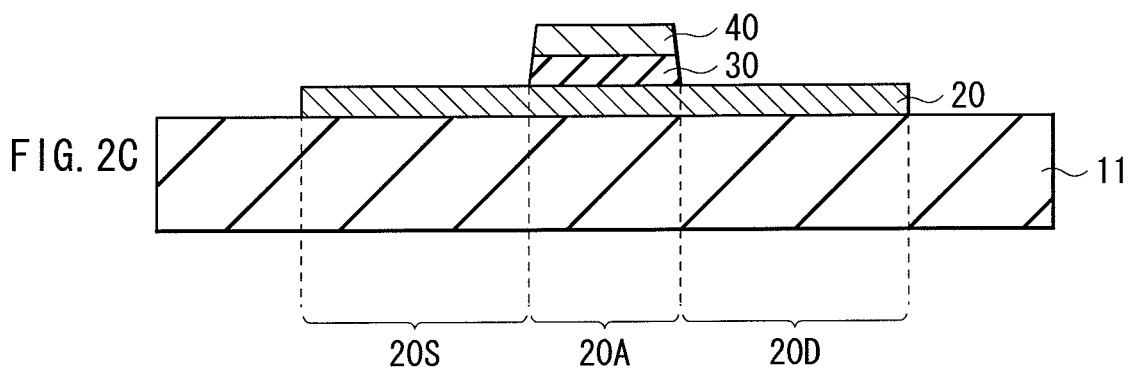

As illustrated in FIG. 2C, after forming the gate electrode material film 40A, the gate electrode material film 40A is shaped into a desired shape with photolithography and etching processes, for example, to form the gate electrode 40 on the channel region 20A of the oxide semiconductor film 20.

Thereafter, referring again to FIG. 2C, the gate electrode 40 is utilized as a mask to etch the gate insulating material film 30A so as to form the gate insulating film 30. Herein, when the oxide semiconductor film 20 is configured by a crystalline material such as ZnO, IZO, and IGO, it is possible to use a chemical solution such as hydrofluoric acid to maintain a significantly large etching selectivity ratio and process easily, in etching the gate insulating material film 30A. Thereby, the gate insulating film 30 and the gate electrode 40 are formed in this order and in the same shape on the channel region 20A of the oxide semiconductor film 20.

Figure 3A:
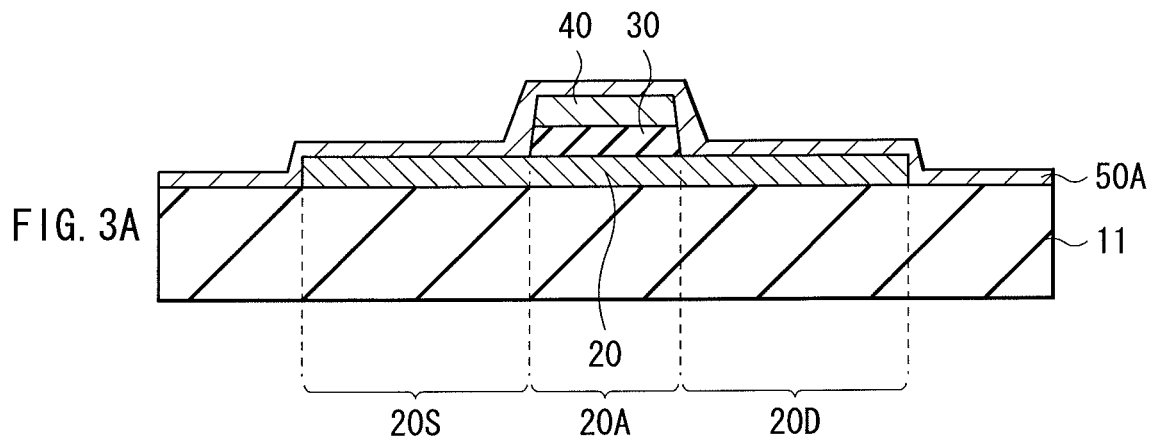
FIGS. 3A to 3C are cross-sectional views illustrating process steps subsequent to those of FIGS. 2A to 2C.

As illustrated in FIG. 3A, after forming the gate insulating film 30 and the gate electrode 40, a metal film 50A, configured of a metal which reacts at a relatively low temperature with oxygen, such as titanium (Ti), aluminum (Al), and indium (In), is formed at a thickness of between 5 nm and 10 nm both inclusive on surfaces of the oxide semiconductor film 20, the gate insulating film 30, and the gate electrode 40 with a sputtering method, for example.

Figure 3B:
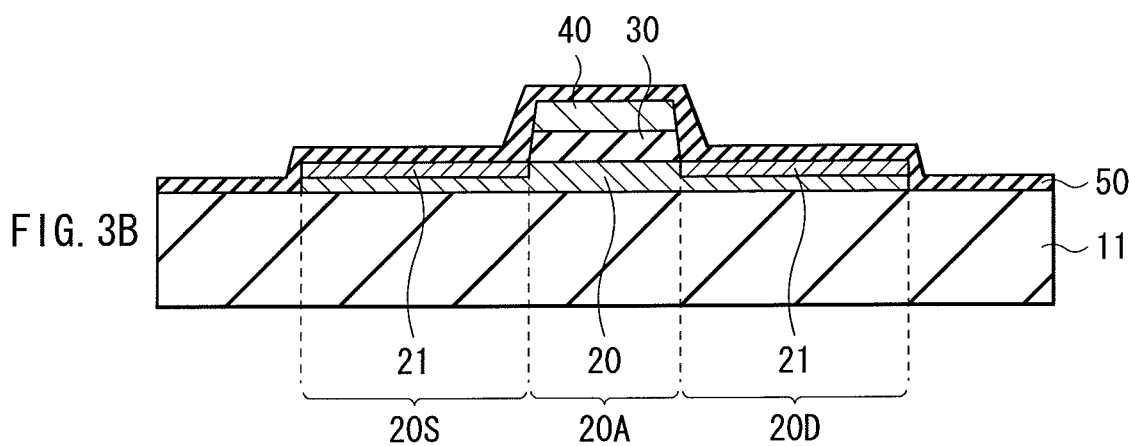

As illustrated in FIG. 3B, after forming the metal film 50A, a heat treatment is performed to oxidize the metal film 50A so as to form the high-resistance film 50. This oxidation reaction of the metal film 50A utilizes a part of oxygen included in the source region 20S and the drain region 20D. Hence, oxygen concentrations in the source region 20S and the drain region 20D start to decrease from the upper faces of the source region 20S and the drain region 20D that contact with the metal film 50A as the oxidation of the metal film 50A progresses. Thereby, a part of each of the source region 20S and the drain region 20D, extending in the depth direction from the upper face of each of the source region 20S and the drain region 20D, is formed with the low-resistance region 21, which has the lower oxygen concentration than that of the channel region 20A.

Figure 4:
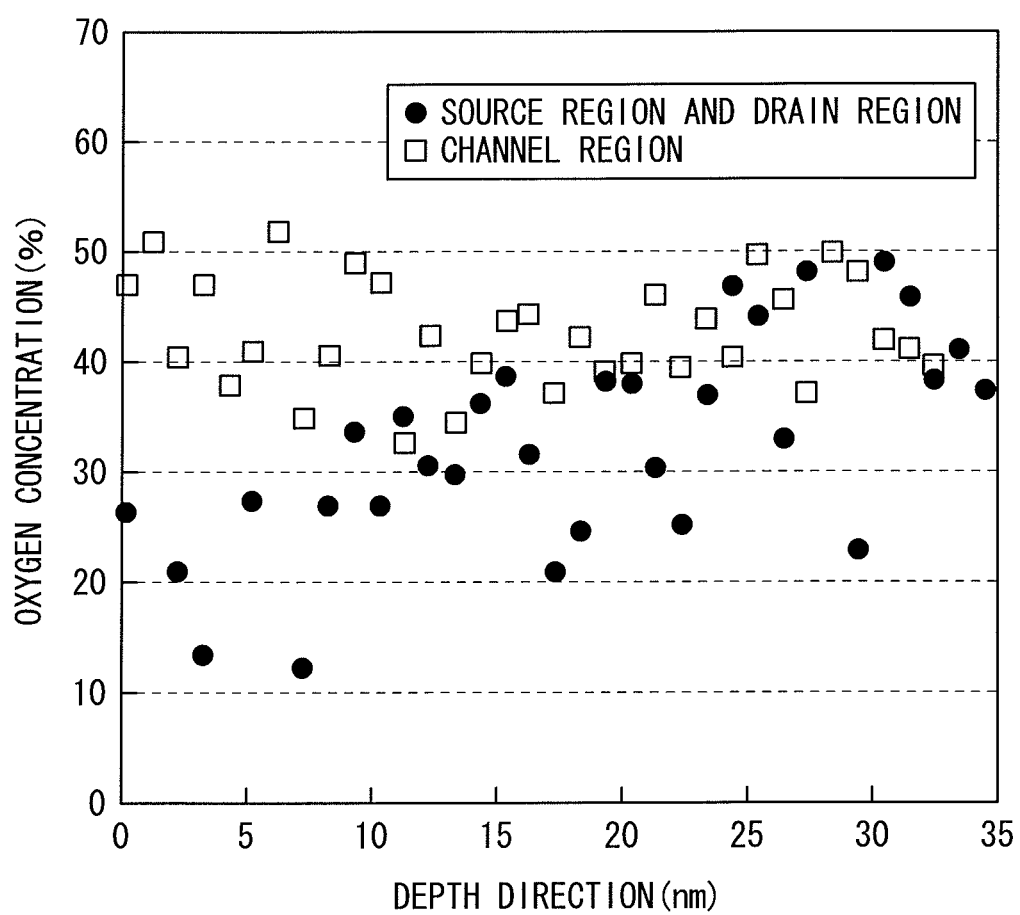
FIG. 4 is a diagram representing a result of energy-dispersive X-ray spectroscopy analysis of a channel region and a low-resistance region.

FIG. 4 represents a result of examination on dependence in the depth direction of the oxygen concentration in the channel region 20A as well as the oxygen concentrations in the source region 20S and the drain region 20D using an energy-dispersive X-ray spectroscopy (EDX) method, after performing the heat treatment of the metal film 50A as in the manufacturing method described above. A material of the oxide semiconductor film 20 was IGZO, and the metal film 50A was an aluminum film which had a thickness of 5 nm. The heat treatment was conducted with annealing at a temperature of 300 degrees centigrade.

As can be seen from FIG. 4, the oxygen concentrations in the source region 20S and the drain region 20D are lower than the oxygen concentration in the channel region 20A throughout in the depth direction. Above all, a difference between the oxygen concentration in the channel region 20A and the oxygen concentrations in the source region 20S and the drain region 20D is highly distinct in a region within the depth of 10 nm, in particular. In other words, it indicates that the low-resistance region 21 is a part of each of the source region 20S and the drain region 20D extending in the depth direction from the upper face thereof, which part, to be more specific, is the region within 10 nm in the depth direction from the upper face thereof.

It is preferable that the heat treatment of the metal film 50A be performed with the annealing at a temperature of about 300 degrees centigrade as described above, for example. Herein, the annealing may be performed under a gas atmosphere having an oxidizing property that includes oxygen etc. This makes it possible to prevent the oxygen concentration of the low-resistance region 21 from being too low and to supply enough oxygen to the oxide semiconductor film 20. This in turn makes it possible to curtail an annealing process performed in a later process step, thereby allowing a simplified manufacturing process.

Also, a temperature of the substrate 11 may be set at a relatively high temperature of about 200 degrees centigrade in the process step of forming the metal film 50A illustrated in FIG. 3A, for example. This enables to form the low-resistance region 21 without performing the heat treatment illustrated in FIG. 3B. In this case, it is possible to reduce the carrier concentration in the oxide semiconductor film 20 to a level desirable for a transistor.

It is preferable that the metal film 50A be formed at the thickness of 10 nm or less as described above. Allowing the thickness of the metal film 50A to be equal to or less than 10 nm makes it possible to completely oxidize the metal film 50A with the heat treatment. When the metal film 50A is not completely oxidized, a process step of removing the metal film 50A with etching may become desirable. The process step of removing with etching is unnecessary when the metal film 50A is completely oxidized and thereby the high-resistance film 50 is obtained, making it possible to simplify the manufacturing process. The thickness of the high-resistance film 50 consequently becomes 20 nm or less when the metal film 50A is formed at the thickness of 10 nm or less.

Herein, other than the heat treatment, it is also possible to promote the oxidation with a method such as an oxidation under a vapor atmosphere and a plasma oxidation, as a method of oxidizing the metal film 50A. In particular, the plasma oxidation can be performed immediately before the formation of the interlayer insulating film 60 with the plasma CVD method in a later process step, and is thus advantageous in that the number of process steps does not have to be increased in particular. It is preferable that the plasma oxidation be performed at conditions where the temperature of the substrate 11 is set at about 200 to 400 degrees centigrade, and where plasma is generated under a gas atmosphere containing oxygen such as oxygen and oxygen dinitride, for example, since this makes it possible to form the high-resistance film 50 having the excellent barrier property against outside air as described above.

It is to be noted that the high-resistance film 50 is also formed on sections such as the gate insulating film 30 and the gate electrode 40, other than on the source region 20S and the drain region 20D of the oxide semiconductor film 20. However, remaining the high-resistance film 50 without removing the same with etching will not be a cause of a leakage current.

Figure 3C:
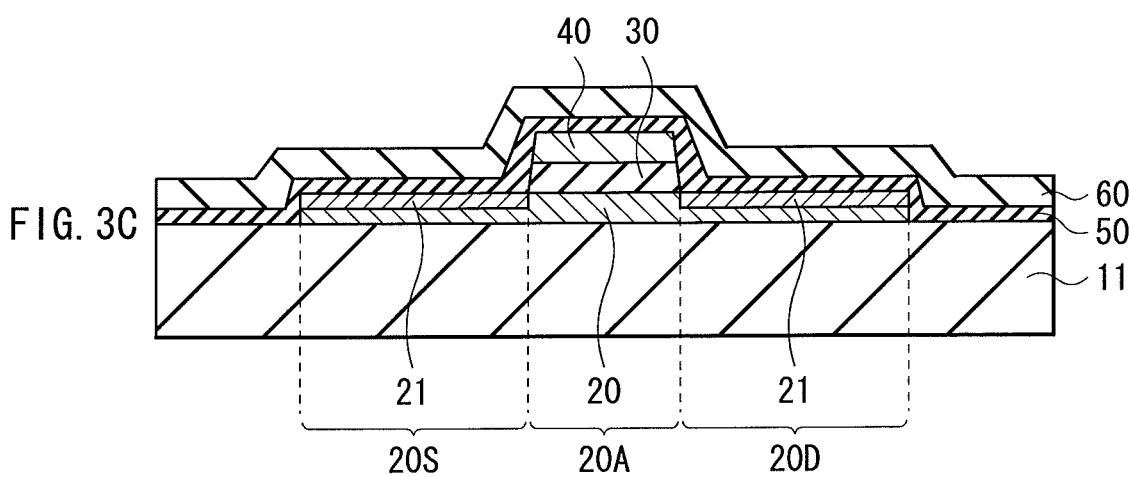

As illustrated in FIG. 3C, after forming the low-resistance region 21, the interlayer insulating film 60, which can be the silicon dioxide film, the aluminum oxide film, or other suitable film, or the multilayer film thereof, is formed at the thickness described above on the high-resistance film 50, for example. Herein, the silicon dioxide film may be formed with a plasma CVD method. It is preferable that the aluminum oxide film be formed with a reactive-sputtering method utilizing an aluminum target and a direct-current (DC) power or an alternating-current (AC) power, since this makes it possible to perform the deposition quickly.

Then, as illustrated in FIG. 1, the connection hole is formed in each of the interlayer insulating film 60 and the high-resistance film 50 with photolithography and etching processes, for example. Then, a film, which can be a molybdenum (Mo) film or other suitable film, is formed at a thickness of about 200 nm on the interlayer insulating film 60 with a sputtering method, for example, and photolithography and etching processes are performed to shape the same into a predetermined shape. Thereby, the source electrode 70S and the drain electrode 70D are connected to the low-resistance regions 21 as illustrated in FIG. 1. Thus, the thin-film transistor 1 illustrated in FIG. 1 is completed.

In this thin-film transistor 1, a current (a drain current) is generated in the channel region 20A of the oxide semiconductor film 20 when a voltage (a gate voltage), which is equal to or higher than a predetermined threshold voltage, is applied to the gate electrode 40 through an unillustrated wiring layer. Herein, at least a part of each of the source region 20S and the drain region 20D extending in the depth direction from the upper face of each of the source region 20S and the drain region 20D is provided with the low-resistance region 21, which is lower in oxygen concentration than that of the channel region 20A. Hence, an element characteristic is stabilized.

Figure 5A:
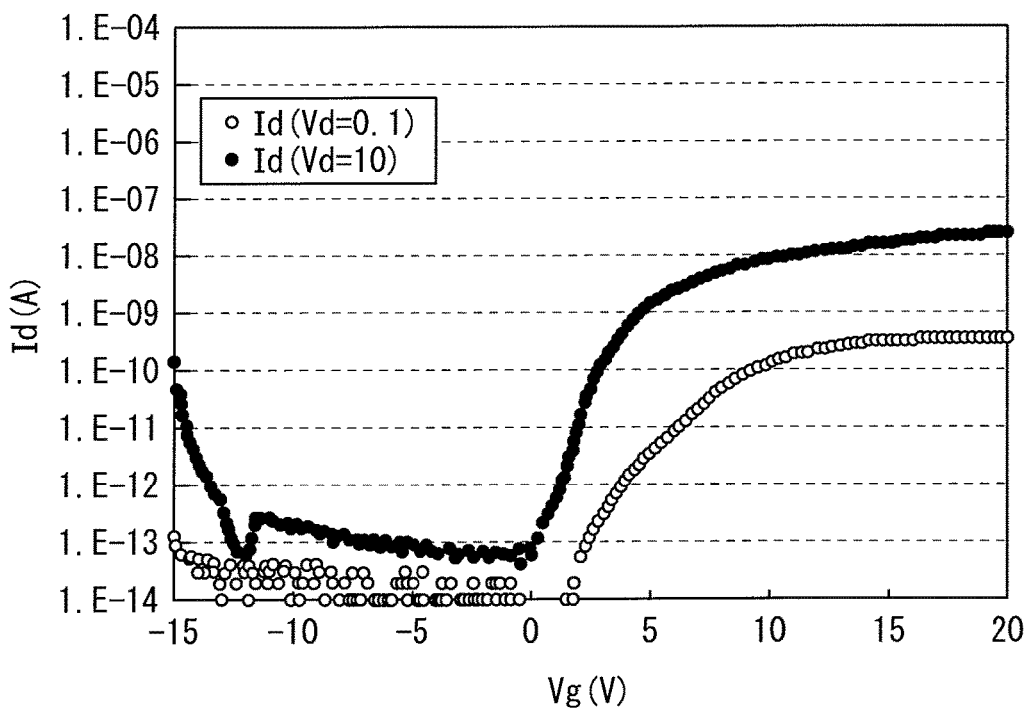
FIGS. 5A and 5B are diagrams comparing characteristics of the thin-film transistor illustrated in FIG. 1 with those of an existing thin-film transistor.
Figure 5B:
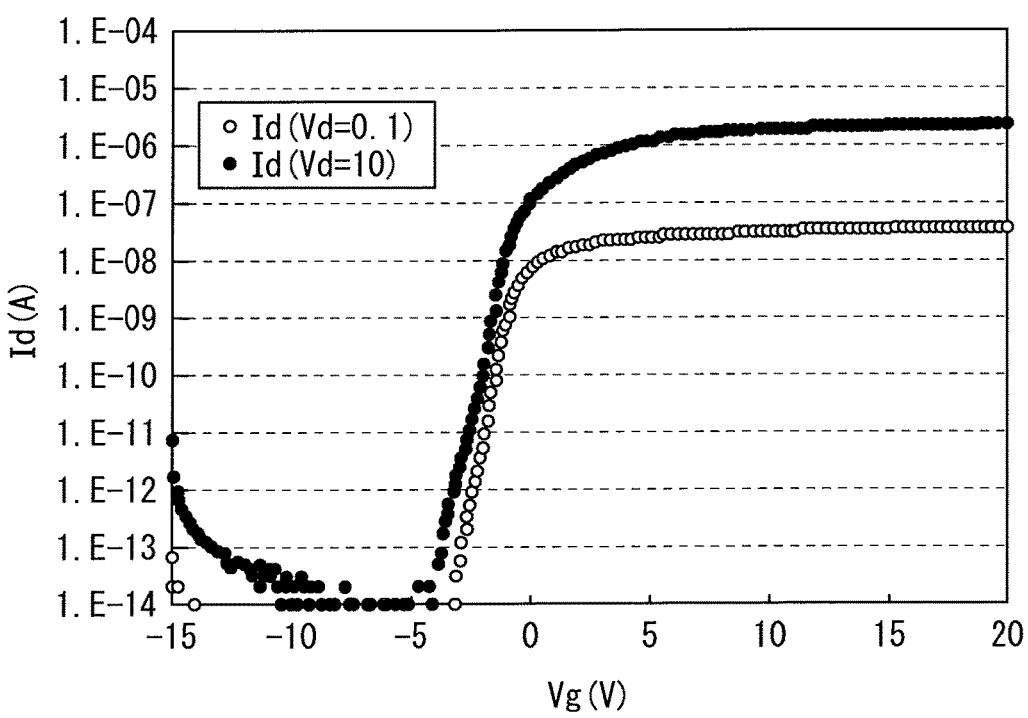

FIG. 5B represents a result of examination on transistor characteristics of the actually-fabricated thin-film transistor 1 having the low-resistance region 21 with the manufacturing method described in the foregoing. The metal film 50A was an aluminum film which had a thickness of 5 nm. The heat treatment was conducted with annealing at a temperature of 300 degrees centigrade under an oxygen atmosphere for one hour to form the low-resistance region 21.

Meanwhile, another thin-film transistor was fabricated without performing the formation and the heat treatment of the metal film to examine transistor characteristics thereof, a result of which is represented in FIG. 5A. Herein, a plasma treatment was not performed.

As can be seen from FIGS. 5A and 5B, an ON-current of a transistor was increased by two digits or more in the thin-film transistor 1 in which the low-resistance region 21 was formed by the heat treatment of the metal film 50A, as compared with the thin-film transistor in which the formation and the heat treatment of the metal film were not conducted. In other words, the examinations indicated that it is possible to achieve the thin-film transistor 1 having a reduced parasitic capacitance by a self-aligned structure and having stabilized element characteristics, by providing the low-resistance region 21 which includes aluminum as a dopant, or which has the lower oxygen concentration than that of the channel region 20A, in at least a part of each of the source region 20S and the drain region 20D of the oxide semiconductor film 20 extending in the depth direction from the upper face thereof.

Thus, in the thin-film transistor 1 according to this embodiment, at least a part of each of the source region 20S and the drain region 20D of the oxide semiconductor film 20 extending in the depth direction from the upper face of each of the source region 20S and the drain region 20D is provided with the low-resistance region 21 having the lower oxygen concentration than that of the channel region 20A. Thereby, a characteristic of a top-gate thin-film transistor having a self-aligned structure is stabilized. Hence, it is possible to achieve high-quality displaying by the thin-film transistor 1 having the self-aligned structure in which the parasitic capacitance is reduced and having the stabilized characteristics, and to address attaining of larger screen, higher definition, and higher frame rate, when the thin-film transistor 1 described in the foregoing is used to configure an active-driving-type display. Also, it is possible to apply a layout having a smaller hold capacitor, and to reduce a proportion of wiring etc. occupying a pixel layout. Hence, it is possible to reduce a probability of occurrence of defects caused by short-circuit between the wirings etc., and to increase a fabrication yield.

According to the manufacturing method of the thin-film transistor 1 of this embodiment, the gate insulating film 30 and the gate electrode 40 are formed in this order and in the same shape on the channel region 20A of the oxide semiconductor film 20. Then, the metal film 50A is formed on the oxide semiconductor film 20, the gate insulating film 30, and the gate electrode 40. Then, the heat treatment is performed on the metal film 50A to oxidize the metal film 50A into the high-resistance film 50, and to form the low-resistance region 21 having the lower oxygen concentration than that of the channel region 20A in a part of each of the source region 20S and the drain region 20D extending in the depth direction from the upper face of each of the source region 20S and the drain region 20D. Thereby, the low-resistance region 21 is formed without using a process step having a large number of varying factors such a plasma process step. Hence, unlike existing techniques, it is possible to solve dependence of an element characteristic on the plasma process step, and to achieve a stable element characteristic.

Second Embodiment

A thin-film transistor according to a second embodiment has a similar configuration as that of the thin-film transistor 1 according to the first embodiment illustrated in FIG. 1, except that a configuration and a manufacturing method of the low-resistance region 21 are different from those in the first embodiment described above. Note that the same or equivalent elements as those according to the first embodiment are denoted with the same reference numerals, and will not be described in detail. Also, process steps corresponding to those in the first embodiment will be described with reference to FIGS. 1 to 3C.

In the thin-film transistor according to this embodiment, the low-resistance region 21 is made low in resistance by containing one or more elements selected from a group including aluminum (Al), boron (B), gallium (Ga), indium (In), titanium (Ti), silicon (Si), germanium (Ge), tin (Sn), and lead (Pb) as a dopant. Thin-film transistor 1 is thereby able to have the self-aligned structure and to stabilize a characteristic.

Herein, it is possible to increase an electron density in an oxide semiconductor when an element such as aluminum (Al), boron (B), gallium (Ga), indium (In), titanium (Ti), silicon (Si), germanium (Ge), tin (Sn), and lead (Pb) is present in the oxide semiconductor since such an element acts as a dopant, and thereby to make the oxide semiconductor low in resistance. It is preferable that a dopant concentration, desirable for making the oxide semiconductor low in resistance, in this case be equal to or more than $1 \times 10^{19}$ cm-3.

The low-resistance region 21 may contain only one of the elements in the group described above, or may contain two or more elements. Also, it is preferable that the dopant concentration of the one or more elements included in the low-resistance region 21 be higher than that of the channel region 20A.

The thin-film transistor 1 according to the second embodiment may be manufactured, for example, as follows.

First, in a similar manner as in the first embodiment, the oxide semiconductor film 20 is formed with the process step illustrated in FIG. 2A. Then, the gate insulating film 30 and the gate electrode 40 are formed in this order and in the same shape on the channel region 20A of the oxide semiconductor film 20 with the process steps illustrated in FIGS. 2B and 2C in a similar manner as in the first embodiment.

Then, the low-resistance region 21, which contains, as a dopant, one or more elements selected from a group including aluminum (Al), boron (B), gallium (Ga), indium (In), titanium (Ti), silicon (Si), germanium (Ge), tin (Sn), and lead (Pb) in a part of each of the source region 20S and the drain region 20D extending in the depth direction from the upper face of each of the source region 20S and the drain region 20D.

The low-resistance region 21 may be formed with the process steps illustrated in FIGS. 3A and 3B in a similar manner manner as in the first embodiment when the low-resistance region 21 contains aluminum (Al), indium (In), or titanium (Ti). More specifically, the metal film 50A configured of aluminum (Al), indium (In), or titanium (Ti) as a dopant material film is formed on the surfaces of the oxide semiconductor film 20, the gate insulating film 30, and the gate electrode 40. Then, the metal film 50A is subjected to the heat treatment, by which the metal film 50A is oxidized, and thus the high-resistance film 50 configured of aluminum oxide, indium oxide, or titanium oxide is formed. This in turn results in the formation of the low-resistance region 21, which includes aluminum (Al), indium (In), or titanium (Ti), in a part of each of the source region 20S and the drain region 20D extending in the depth direction from the upper face thereof.

When the low-resistance region 21 contains boron (B), gallium (Ga), silicon (Si), germanium (Ge), tin (Sn), or lead (Pb), the low-resistance region 21 may also be formed with the same process steps as those in the case of aluminum (Al), indium (In), or titanium (Ti). More specifically, the metal film or the nonmetal film 50A configured of boron (B), gallium (Ga), silicon (Si), germanium (Ge), tin (Sn), or lead (Pb) as the dopant material film is formed on the surfaces of the oxide semiconductor film 20, the gate insulating film 30, and the gate electrode 40. Then, the metal film or the nonmetal film 50A is subjected to the heat treatment, by which the metal film or the nonmetal film 50A is oxidized, and thus the high-resistance film 50 configured of boron oxide, gallium oxide, silicon dioxide, germanium oxide, tin oxide, or lead oxide is formed. This in turn results in the formation of the low-resistance region 21, which includes boron (B), gallium (Ga), silicon (Si), germanium (Ge), tin (Sn), or lead (Pb), in a part of each of the source region 20S and the drain region 20D extending in the depth direction from the upper face thereof.

Figure 6:
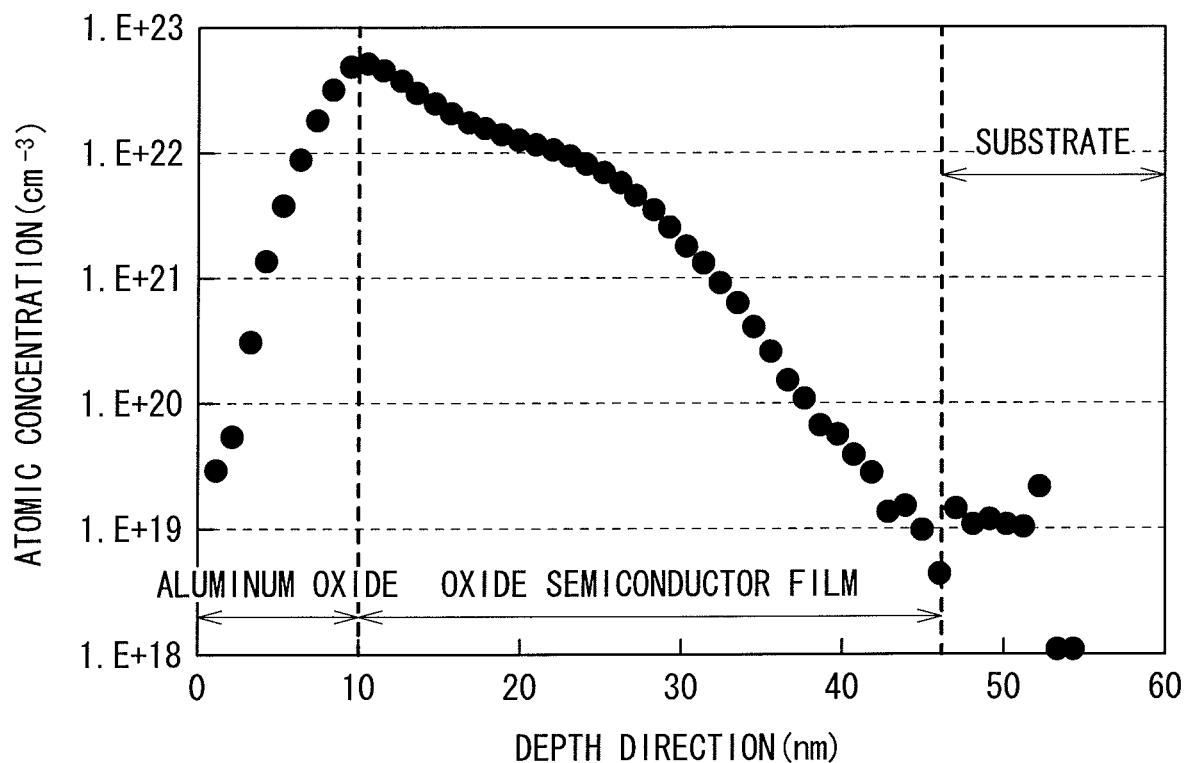
FIG. 6 is a diagram representing a result of measurement of an aluminum concentration of a low-resistance region of a thin-film transistor according to a second embodiment.

FIG. 6 represents a result of measurement of an aluminum concentration in the low-resistance region 21 with a secondary ion mass spectrometry (SIMS) method, by actually fabricating the low-resistance region 21 which includes aluminum (Al) as the dopant with the manufacturing method described in the foregoing. It can be seen from FIG. 6 that the highest concentration of aluminum is included in the vicinity of a surface of the oxide semiconductor, and that aluminum which is $1 \times 1019$ cm-3 or more is included in the oxide semiconductor even in a region 40 nm deep from the surface.

After forming the low-resistance region 21, the interlayer insulating film 60 is formed on the high-resistance film 50 with the process step illustrated in FIG. 3C, in a similar manner as in the first embodiment. Then, as illustrated in FIG. 1, the connection hole is formed in each of the interlayer insulating film 60 and the high-resistance film 50 with photolithography and etching processes, for example.

Then, a film, which can be a molybdenum (Mo) film or other suitable film, is formed at a thickness of about 200 nm on the interlayer insulating film 60 with a sputtering method, for example, and photolithography and etching processes are performed to shape the same into a predetermined shape. Thereby, the source electrode 70S and the drain electrode 70D are connected to the low-resistance regions 21 as again illustrated in FIG. 1. Thus, the thin-film transistor 1 illustrated in FIG. 1 is completed.

In this thin-film transistor 1, the current (the drain current) is generated in the channel region 20A of the oxide semiconductor film 20 when the voltage (the gate voltage), which is equal to or higher than a predetermined threshold voltage, is applied to the gate electrode 40, as in the first embodiment. Herein, at least a part of each of the source region 20S and the drain region 20D extending in the depth direction from the upper face of each of the source region 20S and the drain region 20D is provided with the low-resistance region 21, which contains one or more elements selected from a group including aluminum (Al), boron (B), gallium (Ga), indium (In), titanium (Ti), silicon (Si), germanium (Ge), tin (Sn), and lead (Pb) as a dopant. Hence, an element characteristic is stabilized.

Thus, in the thin-film transistor 1 according to the second embodiment, at least a part of each of the source region 20S and the drain region 20D of the oxide semiconductor film 20 extending in the depth direction from the upper face of each of the source region 20S and the drain region 20D is provided with the low-resistance region 21, which contains one or more elements selected from a group including aluminum (Al), boron (B), gallium (Ga), indium (In), titanium (Ti), silicon (Si), germanium (Ge), tin (Sn), and lead (Pb) as a dopant. Thereby, a characteristic of a top-gate thin-film transistor having a self-aligned structure is stabilized. Hence, it is possible to achieve high-quality displaying by the thin-film transistor 1 having the self-aligned structure in which the parasitic capacitance is reduced and having the stabilized characteristics, and to address the attaining of larger screen, higher definition, and higher frame rate, when the thin-film transistor 1 described in the foregoing is used to configure an active-driving-type display. Also, it is possible to apply a layout having a smaller hold capacitor, and to reduce a proportion of wiring etc. occupying a pixel layout. Hence, it is possible to reduce a probability of occurrence of defects caused by short-circuit between the wirings etc., and to increase a fabrication yield.

According to the manufacturing method of the thin-film transistor 1 of the second embodiment, the gate insulating film 30 and the gate electrode 40 are provided in this order and in the same shape on the channel region 20A of the oxide semiconductor film 20. Then, the metal film or the nonmetal film 50A is formed as the dopant material film on the oxide semiconductor film 20, the gate insulating film 30, and the gate electrode 40. Then, the heat treatment is performed on the metal film or the nonmetal film 50A to oxidize the metal film or the nonmetal 50A into the high-resistance film 50, and to form the low-resistance region 21, which contains one or more elements selected from a group including aluminum (Al), boron (B), gallium (Ga), indium (In), titanium (Ti), silicon (Si), germanium (Ge), tin (Sn), and lead (Pb) as a dopant, in a part of each of the source region 20S and the drain region 20D extending in the depth direction from the upper face of each of the source region 20S and the drain region 20D. Thereby, the low-resistance region 21 is formed without using a process step having a large number of varying factors such a plasma process step. Hence, unlike existing techniques, it is possible to solve dependence of an element characteristic on the plasma process step, and to achieve a stable element characteristic.

First Modification

Figure 7:
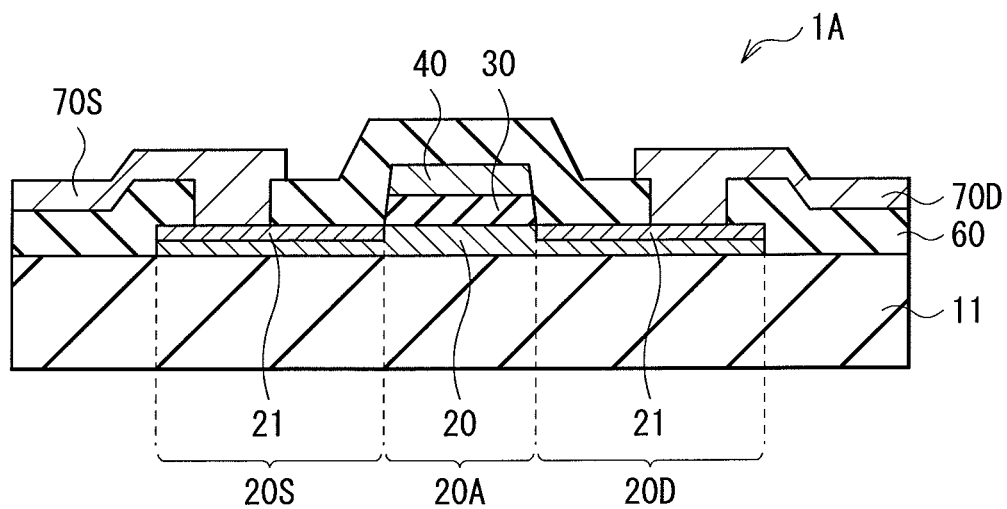
FIG. 7 is a cross-sectional view illustrating a configuration of a thin-film transistor according to a first modification.

FIG. 7 illustrates a cross-sectional configuration of a thin-film transistor 1A according to a first modification. The thin-film transistor 1A has a configuration, an operation, and an effect, which are similar to those of the thin-film transistor 1 according to the first embodiment described above, except that the high-resistance film 50 is not provided so as to reduce a leakage current.

The thin-film transistor 1A may be manufactured, for example, as follows. First, in a similar manner as in the first embodiment, the oxide semiconductor film 20, the gate insulating film 30, the gate electrode 40, and the metal film 50A are formed on the substrate 11, and the metal film 50A is subjected to the heat treatment to form the low-resistance region 21 and the high-resistance film 50, with the process steps illustrated in FIGS. 2A to 3B. Then, as illustrated in FIG. 8A, the high-resistance film 50 is removed with etching. Herein, the use of a dry-etching method utilizing gas, which contains chlorine etc., makes it possible to easily remove the high-resistance film 50 as well as the metal film 50A that has not been completely oxidized. Then, as illustrated in FIG. 8B, the interlayer insulating film 60 is formed in a similar manner as in the first embodiment. Then, as illustrated in FIG. 8C, the connection holes are provided in the interlayer insulating film 60, and the source electrode 70S and the drain electrode 70D are connected to the low-resistance regions 21, in a similar manner as in the first embodiment.

Third Embodiment

Figure 9:
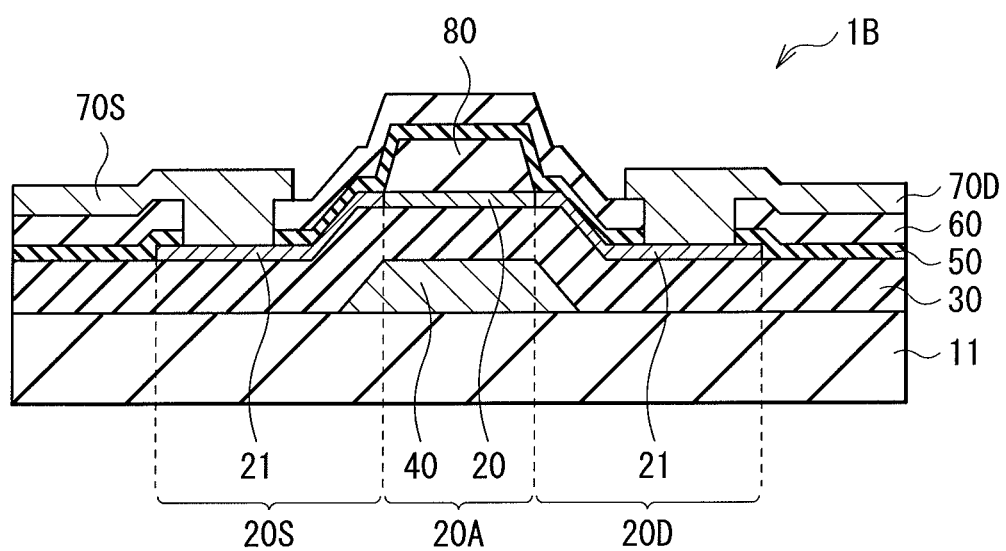
FIG. 9 is a cross-sectional view illustrating a configuration of the thin-film transistor according to the second embodiment.

FIG. 9 illustrates a cross-sectional configuration of a thin-film transistor 1B according to a third embodiment. The thin-film transistor 1B has a similar configuration as that of the thin-film transistor 1 according to the first embodiment described above, except that the thin-film transistor 1B is a bottom-gate thin-film transistor in which the gate electrode 40, the gate insulating film 30, the oxide semiconductor film 20, a channel protecting film 80, the interlayer insulating film 60, the source electrode 70S, and the drain electrode 70D are stacked in this order on the substrate 11. Note that the same or equivalent elements as those according to the first embodiment are denoted with the same reference numerals, and will not be described in detail.

The channel protecting film 80 is provided on the channel region 20A of the oxide semiconductor film 20. The channel protecting film 80 may have a thickness of about 200 nm, and may be configured of a monolayer film, which can be a silicon dioxide film, a silicon nitride film, an aluminum oxide film, or other suitable film, or a multilayer film thereof, for example.

The thin-film transistor 1B may be manufactured, for example, as follows. Note that reference is made to the first embodiment to describe process steps that are same as those in the first embodiment.

First, a film, which can be a molybdenum (Mo) film or other suitable film, is formed at a thickness of about 200 nm on the entire surface of the substrate 11 with a method such as a sputtering method and an evaporation method, for example. The molybdenum film is patterned with a photolithography method, for example, to form the gate electrode 40 as illustrated in FIG. 10A.

Figure 10A:
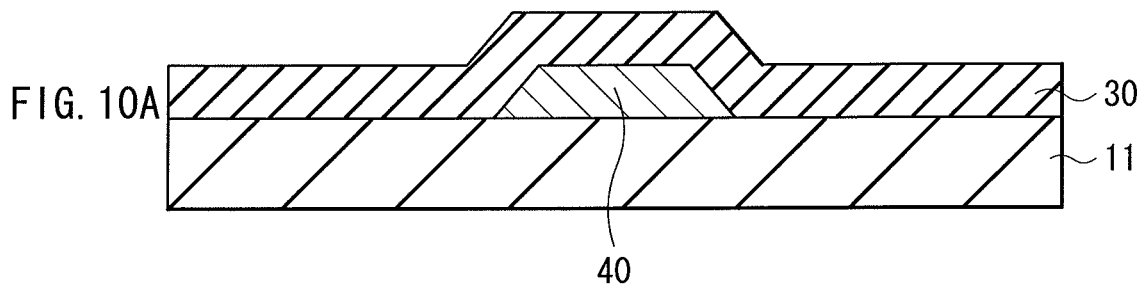
FIGS. 10A to 10D are cross-sectional views illustrating a manufacturing method of the thin-film transistor illustrated in FIG. 9 in order of process steps.

Then, as again illustrated in FIG. 10A, the gate insulating film 30, which can be a silicon dioxide film, an aluminum oxide film, or other suitable film, is formed at a thickness of about 300 nm on the entire surface of the substrate 11 on which the gate electrode 40 is formed, with a plasma CVD method, for example.

Figure 10B:
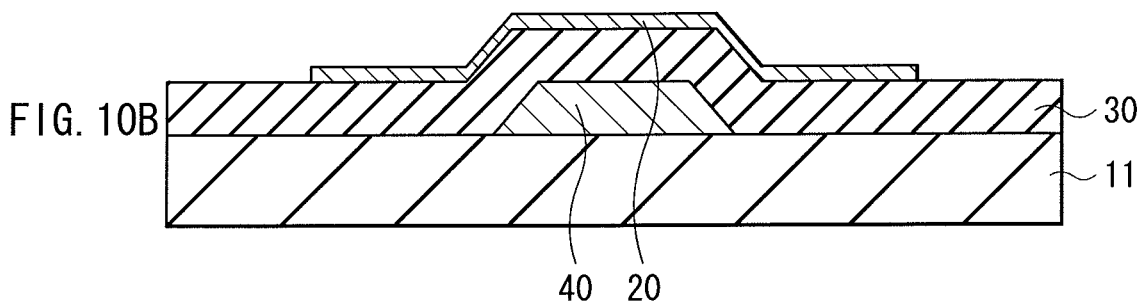

Then, as illustrated in FIG. 10B, the oxide semiconductor film 20 is formed on the gate insulating film 30 in a similar manner as in the first embodiment.

Figure 10C:
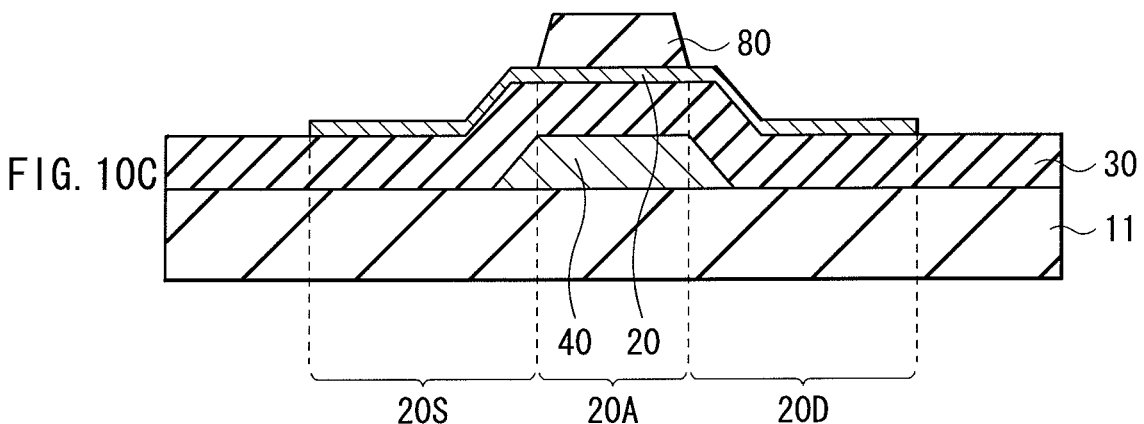

Then, a channel protecting material film, which can be a monolayer film of a silicon dioxide film, a silicon nitride film, an aluminum oxide film, or other suitable film, or a multilayer film thereof, is formed at a thickness of about 200 nm on the entire surfaces of the oxide semiconductor film 20 and the gate insulating film 30. Then, as illustrated in FIG. 10C, a back-side exposure, in which the gate electrode 40 is utilized as a mask, is used to form the channel protecting film 80 at a position close to the gate electrode 40 in a self-aligned fashion.

Figure 10D:
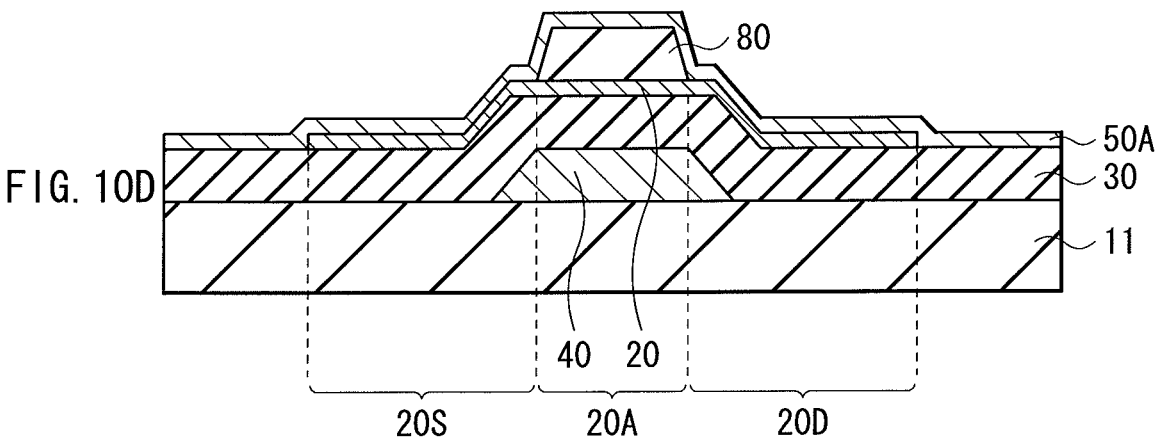

As illustrated in FIG. 10D, after forming the channel protecting film 80, the metal film 50A is formed on the oxide semiconductor film 20 and the channel protecting film 80 in a similar manner as in the first embodiment.

Figure 11A:
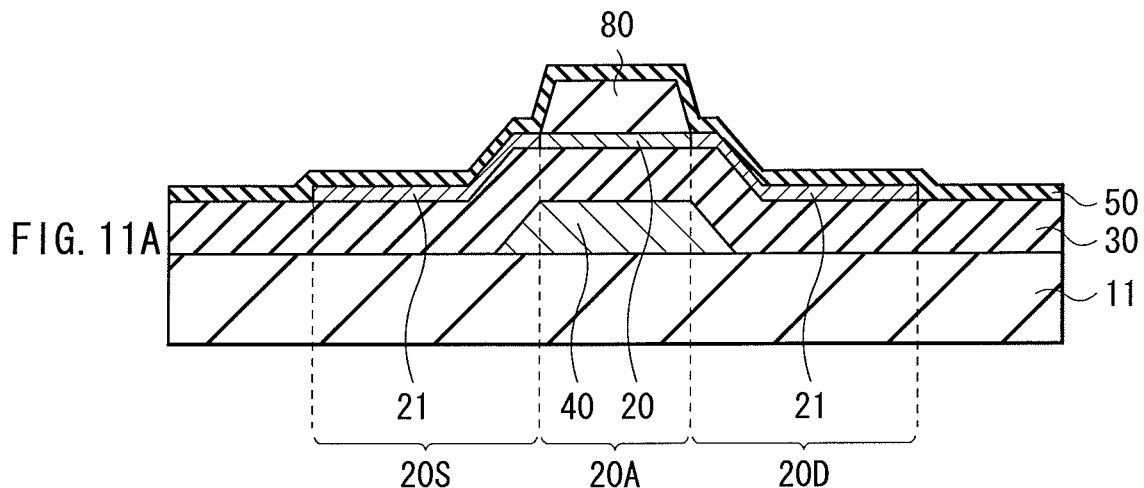
FIGS. 11A to 11C are cross-sectional views illustrating process steps subsequent to those of FIGS. 10A to 10D.

Then, as illustrated in FIG. 11A, the heat treatment is performed to oxidize the metal film 50A so as to form the high-resistance film 50, and to form the low-resistance region 21 having the lower oxygen concentration than that of the channel region 20A in a part of each of the source region 20S and the drain region 20D extending in the depth direction from the upper face of each of the source region 20S and the drain region 20D.

Figure 11B:
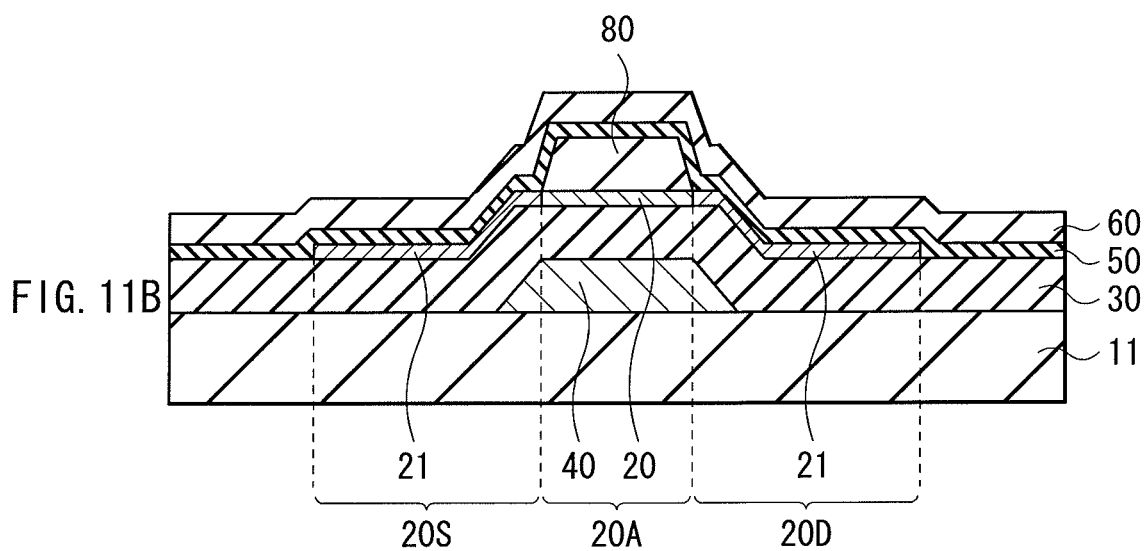

As illustrated in FIG. 11B, after forming the low-resistance region 21 and the high-resistance film 50, the interlayer insulating film 60 is formed on the high-resistance film 50 in a similar manner as in the first embodiment.

Figure 11C:
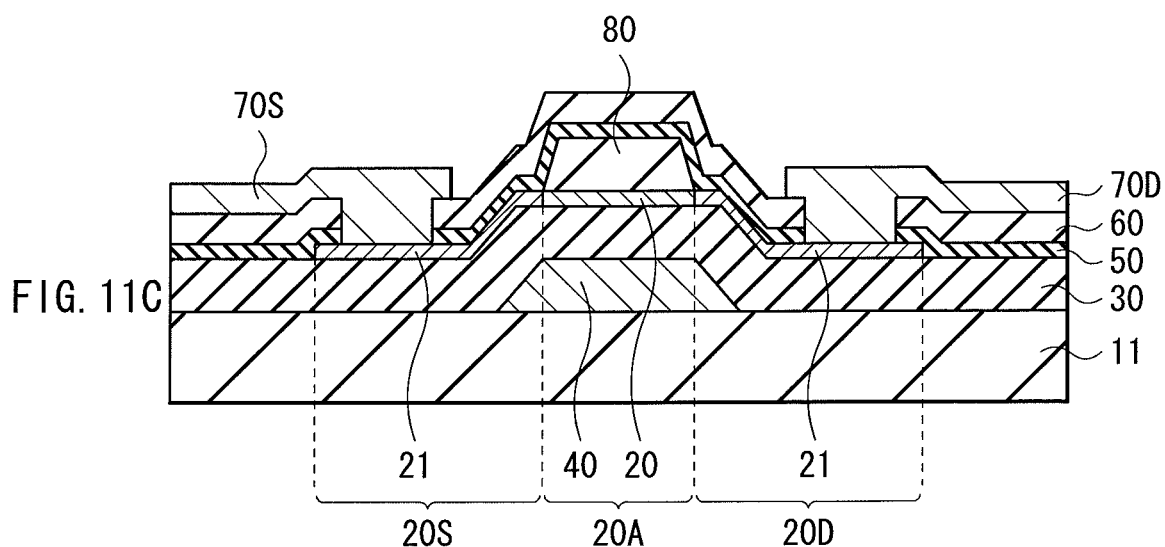

As illustrated in FIG. 11C, after forming the interlayer insulating film 60, the connection holes are provided in each of the interlayer insulating film 60 and the high-resistance film 50, and the source electrode 70S and the drain electrode 70D are connected to the low-resistance regions 21, in a similar manner as in the first embodiment. Thus, the thin-film transistor 1B illustrated in FIG. 9 is completed.

An operation and an effect of the thin-film transistor 1B according to the third embodiment are similar to those of the first embodiment.

Second Modification

Figure 12:
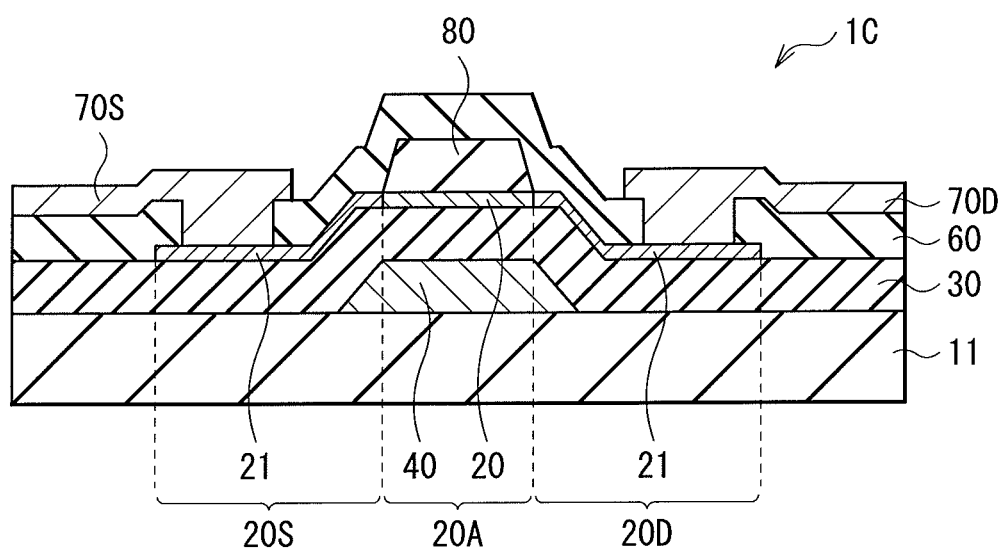
FIG. 12 is a cross-sectional view illustrating a configuration of a thin-film transistor according to a second modification.

FIG. 12 illustrates a cross-sectional configuration of a thin-film transistor 1C according to a second modification. The thin-film transistor 1C has a configuration, an operation, and an effect, which are similar to those of the thin-film transistor 1B according to the third embodiment described above, except that the high-resistance film 50 is not provided so as to reduce a leakage current.

Figure 13A:
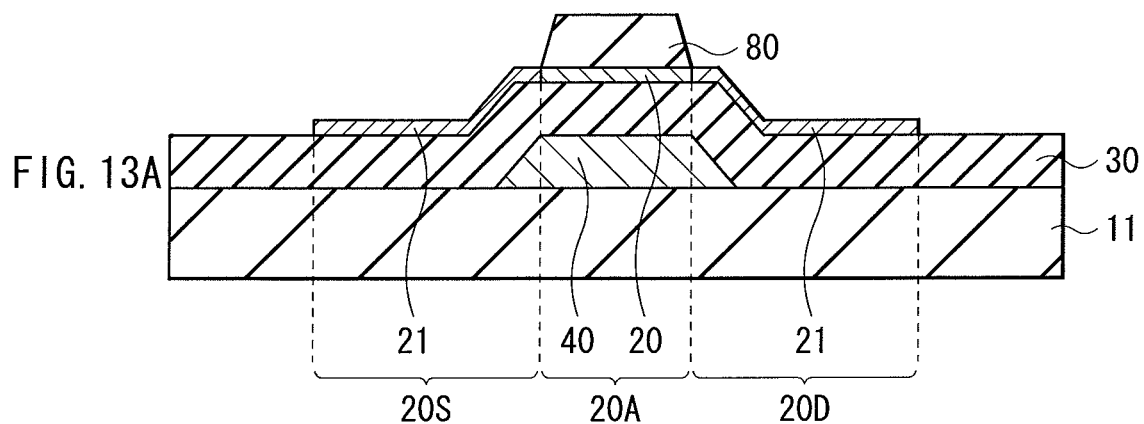
FIGS. 13A to 13C are cross-sectional views illustrating a manufacturing method of the thin-film transistor illustrated in FIG. 12 in order of process steps.
Figure 13B:
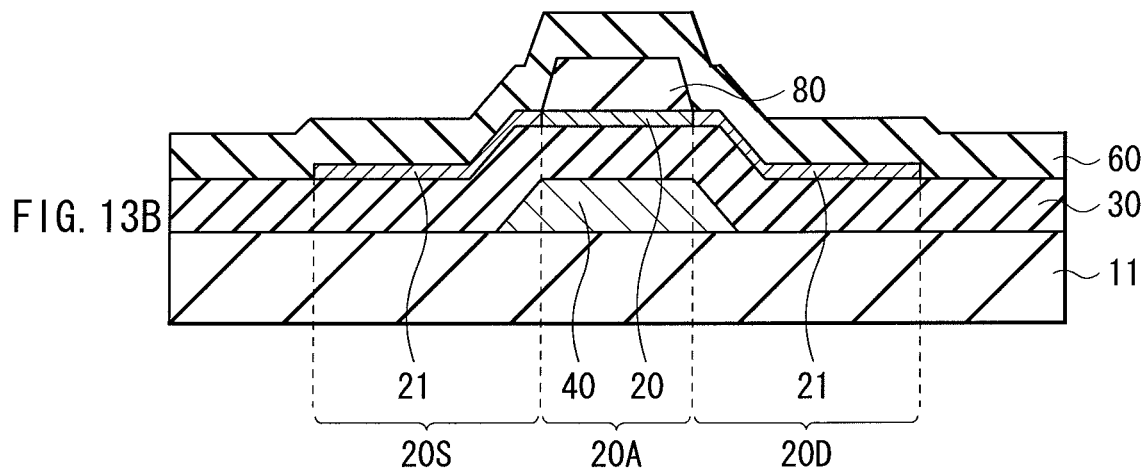
Figure 13C:
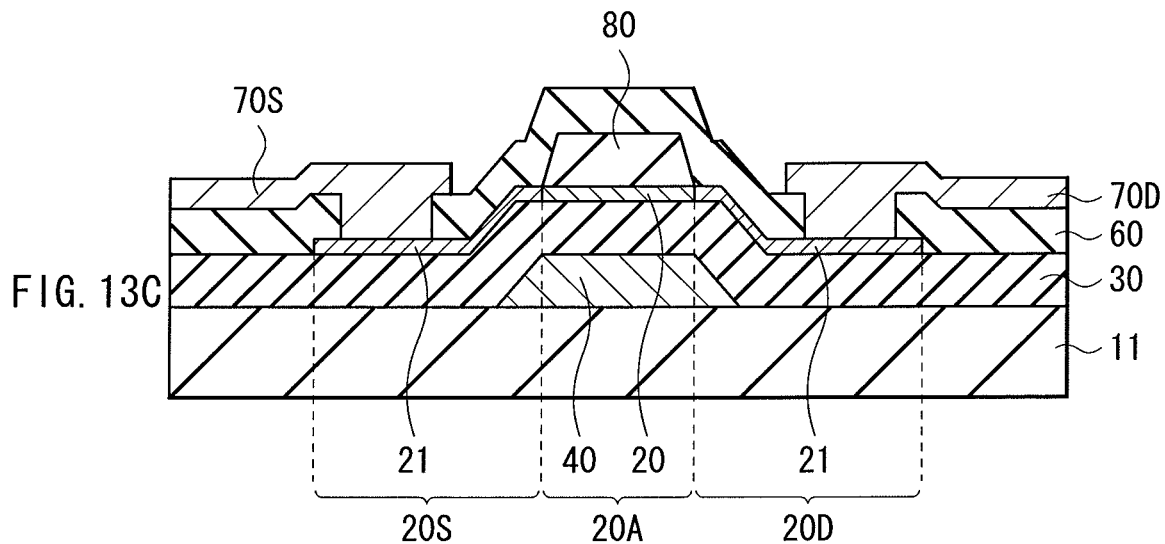

The thin-film transistor 1C may be manufactured, for example, as follows. First, in a similar manner as in the third embodiment, the gate electrode 40, the gate insulating film 30, the oxide semiconductor film 20, the channel protecting film 80, and the metal film 50A are formed on the substrate 11, and the metal film 50A is subjected to the heat treatment to form the low-resistance region 21 and the high-resistance film 50, with the process steps illustrated in FIGS. 10A to 10D. Then, as illustrated in FIG. 13A, the high-resistance film 50 is removed with etching. Then, as illustrated in FIG. 13B, the interlayer insulating film 60 is formed in a similar manner as in the third embodiment. Then, as illustrated in FIG. 13C, the connection holes are provided in the interlayer insulating film 60, and the source electrode 70S and the drain electrode 70D are connected to the low-resistance regions 21, in a similar manner as in the third embodiment.

Fourth Embodiment

Figure 14:
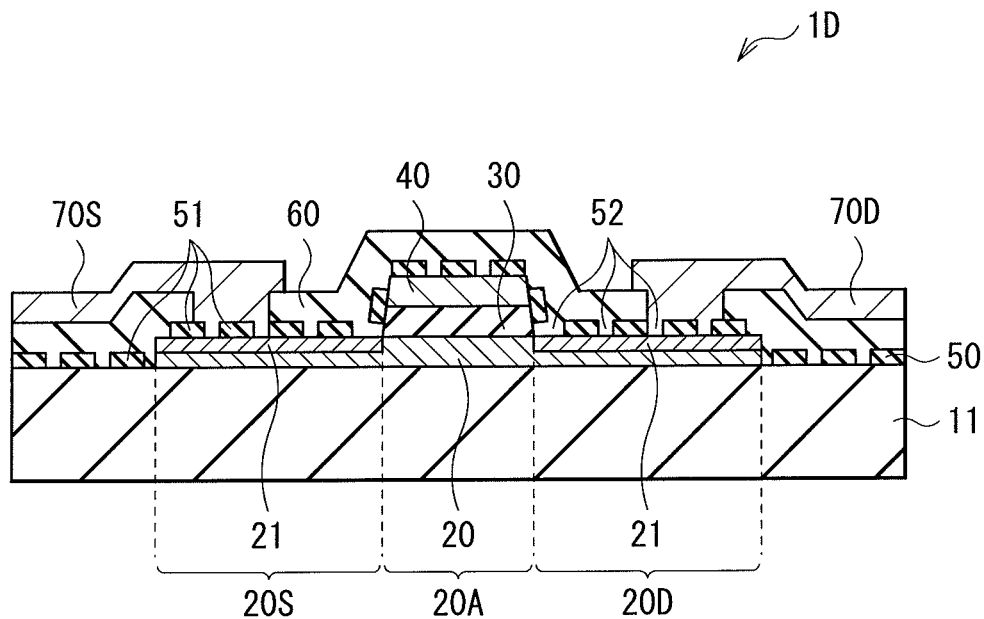
FIG. 14 is a cross-sectional view illustrating a configuration of a thin-film transistor according to a third embodiment.

FIG. 14 illustrates a configuration of a thin-film transistor 1D according to a fourth embodiment. The thin-film transistor 1D has a similar configuration as that of the thin-film transistor 1 according to the first embodiment described above, except that the high-resistance film 50 is configured by a plurality of discontinuous island-shaped high-resistance films 51. Note that the same or equivalent elements as those according to the first embodiment are denoted with the same reference numerals, and will not be described in detail.

Figure 15:
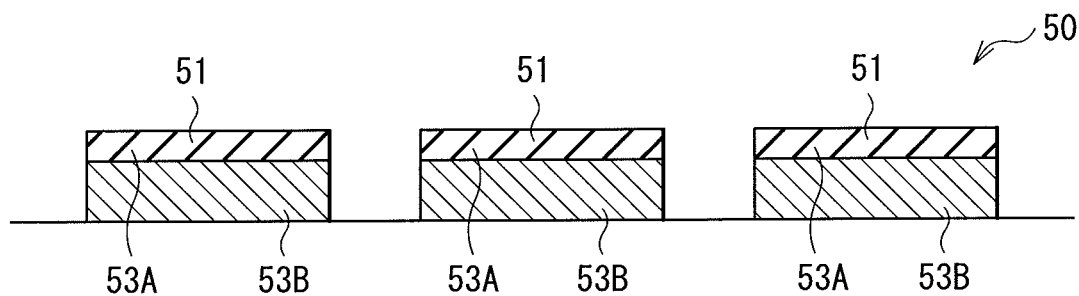
FIG. 15 is a cross-sectional view illustrating an example of island-shaped high-resistance films.
Figure 16:
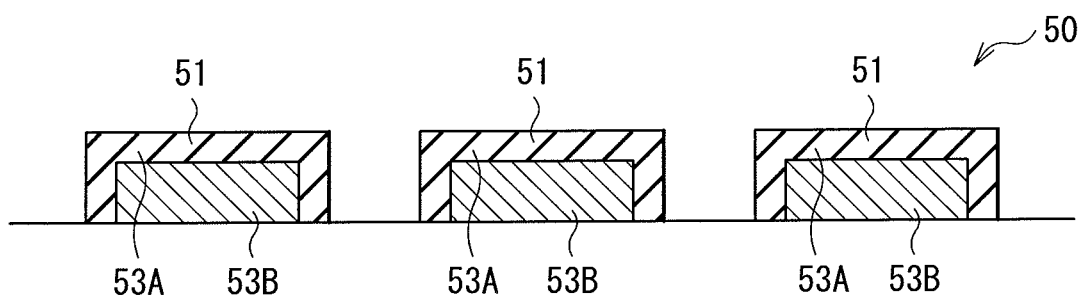
FIG. 16 is a cross-sectional view illustrating another example of the island-shaped high-resistance films.
Figure 17:
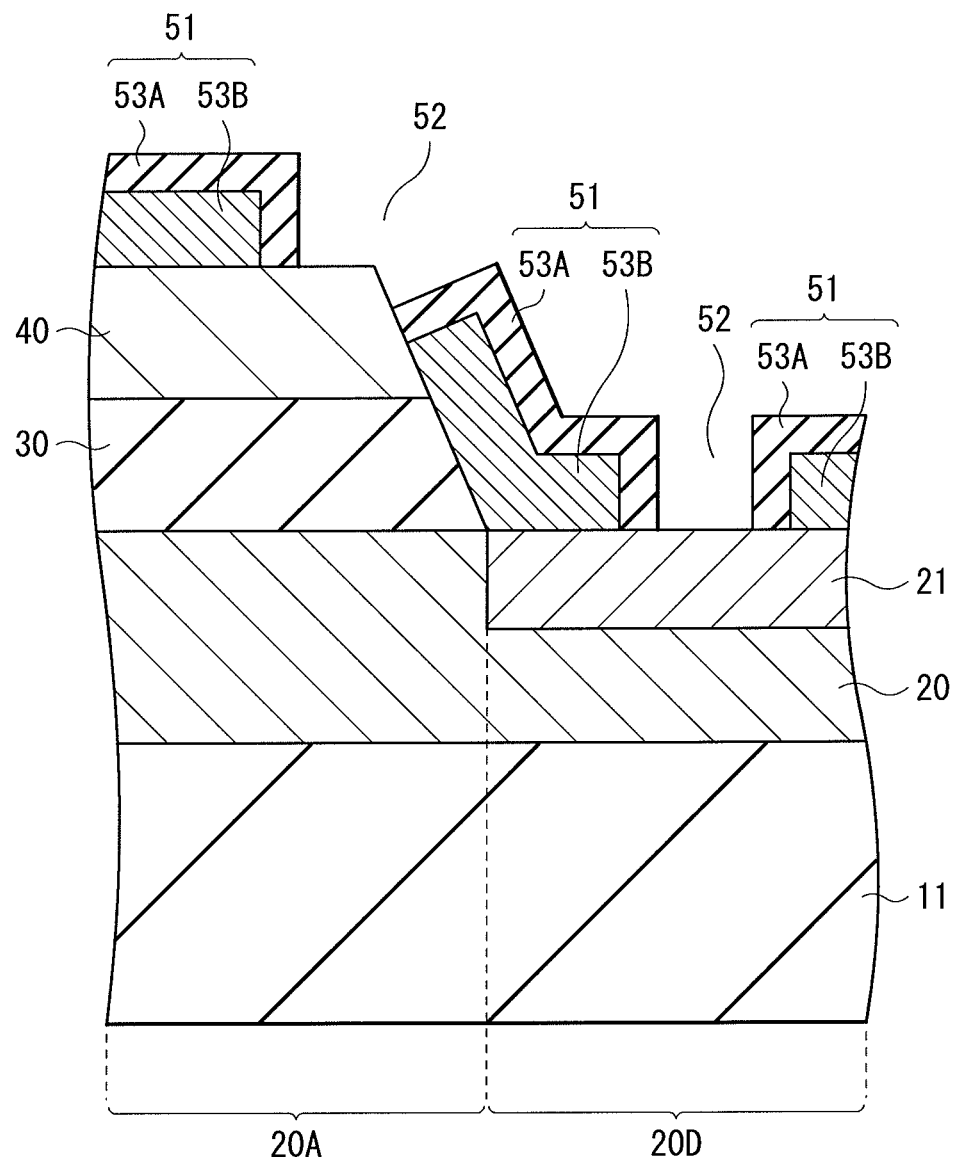
FIG. 17 is an explanatory view for describing sizes of the island-shaped high-resistance films.

Each of the island-shaped high-resistance films 51 may be configured of aluminum oxide, for example. Herein, the island-shaped high resistance film 51 does not necessarily have to be configured by aluminum oxide in its entirety in a thickness direction thereof. For example, as illustrated in FIG. 15, the island-shaped high resistance film 51 may have a configuration in which only an upper surface thereof is configured of aluminum oxide as an oxidized section 53A, and in which a section (or a lower part) other than the upper surface is configured of metallic aluminum as an unoxidized section 53B. Alternatively, as illustrated in FIG. 16, the island-shaped high resistance film 51 may have a configuration in which the upper surface and side faces thereof are each configured of aluminum oxide as the oxidized section 53A, and in which a section (or a central part) other than the upper surface and the side faces is configured of metallic aluminum as the unoxidized section 53B, for example.

There is a clearance gap 52 between the adjacent island-shaped high-resistance films 51. The clearance gap 52 allows the adjacent island-shaped high-resistance films 51 to be physically separated from each other, and thereby each of the island-shaped high-resistance films 51 has an island-shaped configuration where the adjacent island-shaped high-resistance films 51 are not two-dimensionally connected to each other. Hence, the island-shaped high-resistance films 51 hardly flow electricity in an in-plane direction mutually, making it possible to block the leakage current from the gate electrode 40 to the source electrode 70S or from the gate electrode 40 to the drain electrode 70D. Planar shapes of the island-shaped high-resistance films 51 and the clearance gap 52 are not particularly limited. The island-shaped high-resistance film 51 and the clearance gap 52 each may have an irregular planar shape.

It is preferable that the plurality of island-shaped high-resistance films 51 are separated from one another by the clearance gap 52, at least at one position between the gate electrode 40 and the oxide semiconductor film 20 (side faces of the gate insulating film 30). In other words, it is preferable that side which is the longest among the island-shaped high-resistance films 51 be shorter in length than a thickness of the gate insulating film 30. This prevents the possibility that, when an island-shaped metal film 51A is not completely oxidized in a later-described manufacturing process and thus the unoxidized section 53B configured of a metal is remained inside of the island-shaped high-resistance film 51, the unoxidized section 53B of the island-shaped high-resistance film 51 may contact with both a side face of the gate electrode 40 and the upper face of the low-resistance region 21, and thereby short-circuit is generated between the gate electrode 40 and the source electrode 70S or between the gate electrode 40 and the drain electrode 70D.

The thin-film transistor 1D may be manufactured, for example, as follows.

Figure 18A:
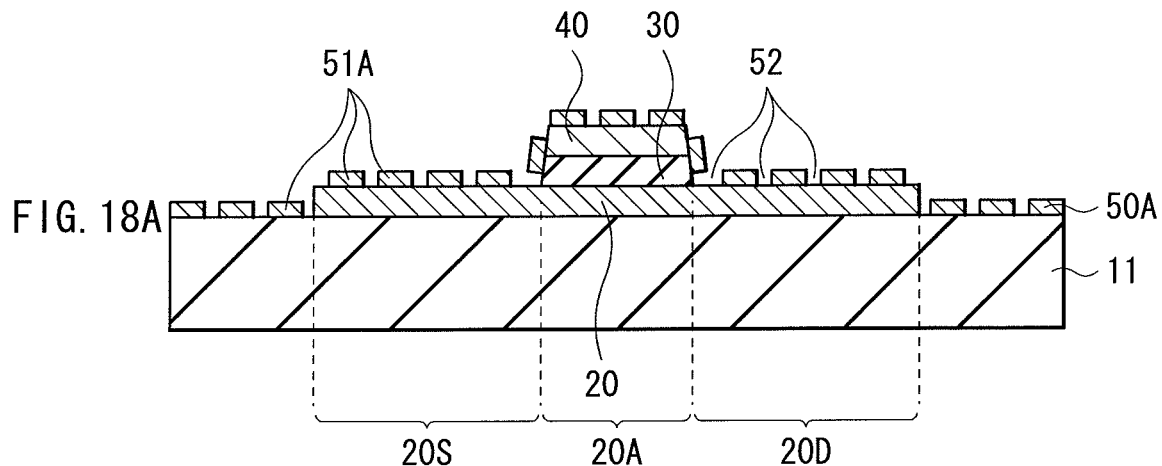
FIGS. 18A to 18C are cross-sectional views illustrating a manufacturing method of the thin-film transistor illustrated in FIG. 14 in order of process steps.
Figure 18B:
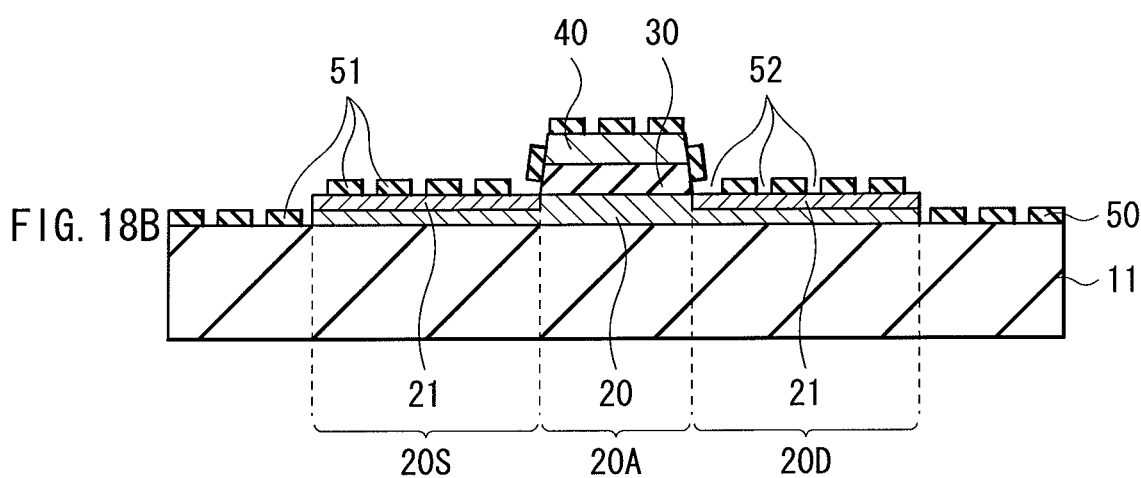
Figure 18C:
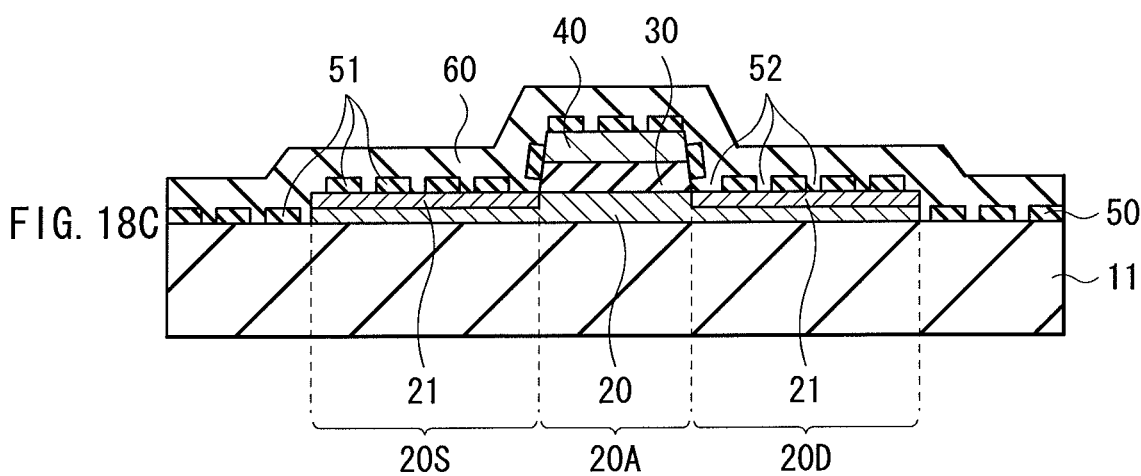

FIGS. 18A to 18C illustrate a manufacturing method of the thin-film transistor 1D illustrated in FIG. 14 in order of process steps. Note that reference is made to FIGS. 2A to 2C to describe process steps that are same as those in the first embodiment.

First, the oxide semiconductor film 20 is formed with the process step illustrated in FIG. 2A in a similar manner as in the first embodiment. Then, the gate insulating film 30 and the gate electrode 40 are formed in this order and in the same shape on the channel region 20A of the oxide semiconductor film 20 with the process steps illustrated in FIGS. 2B and 2C in a similar manner as in the first embodiment.

Figure 19A:
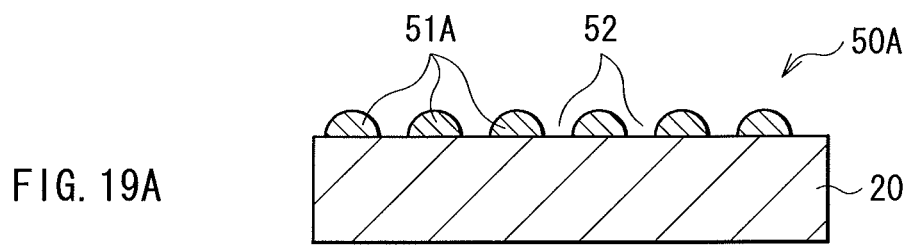
FIGS. 19A to 19D are cross-sectional views for describing the process steps illustrated in FIGS. 18A to 18C in detail.

Then, as illustrated in FIG. 18A, the metal film 50A configured of the plurality of island-shaped metal films 51A, which are made of aluminum (Al), is formed on the surfaces of the oxide semiconductor film 20, the gate insulating film 30, and the gate electrode 40. FIG. 19A schematically illustrates the metal film 50A configured of the plurality of island-shaped metal films 51A in an enlarged fashion. The clearance gaps 52 are generated among the plurality of island-shaped metal films 51A.

Figure 20:
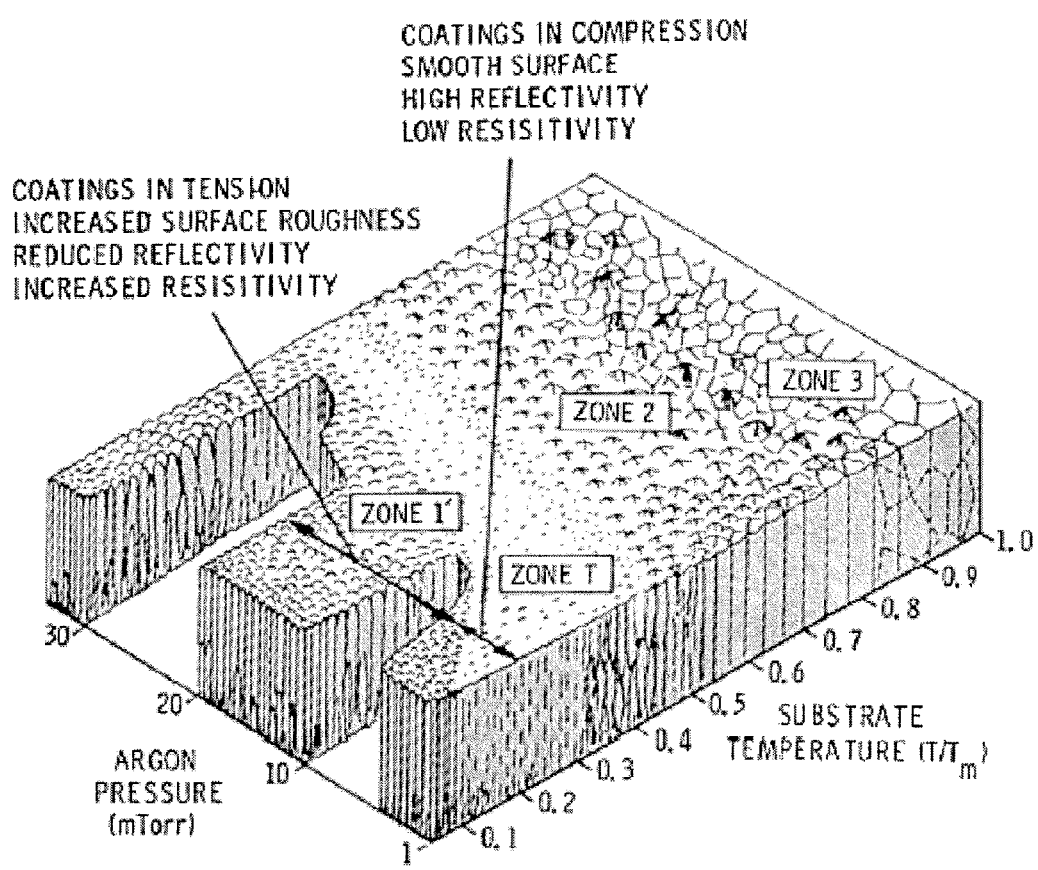
FIG. 20 illustrates the Thornton's model.

A method such as a vacuum evaporation method and a sputtering method is suitable as a technique of forming the metal film 50A. The most suitable technique for forming the metal film 50A configured of the plurality of island-shaped metal films 51A is the sputtering method. FIG. 20 represents the Thornton's model in a sputtering method, where T is a substrate temperature, and Tm is a melting point of a material. In a sputtering method, differences in crystallinity and grain size distribution of a to-be-formed film occur by varying a temperature of a substrate and a pressure of argon (Ar) serving as sputtering gas. A state referred to as "ZONE 3" is obtained when T/Tm is large and the pressure of argon is low, i.e., the energy of particles to be sputtered is extremely large and a metal film is easy to move on a substrate, by which an extremely dense film is formed. On the other hand, a state referred to as "ZONE 1" is obtained when T/Tm is small and the pressure of argon is high. In the state of "ZONE 1", the film is rough even when the film is made very thick. That is, formation of the island-shaped films is possible in an early process of formation. Hence, it is possible to form the metal film 50A configured of the plurality of island-shaped metal films 51A by suitably adjusting the substrate temperature and the argon pressure when depositing the metal film 50A.

Then, as illustrated in FIG. 18B, the heat treatment is performed in a similar manner as in the first embodiment to oxidize the plurality of island-shaped metal films 51A of the metal film 50A, by which the high-resistance film 50 having the plurality of island-shaped high-resistance film 51 configured of aluminum oxide is formed. This in turn results in the formation of the low-resistance region 21, which includes aluminum as a dopant, or which has the lower oxygen concentration than that of the channel region 20A, in a part of each of the source region 20S and the drain region 20D extending in the depth direction from the upper face thereof.

Figure 19B:
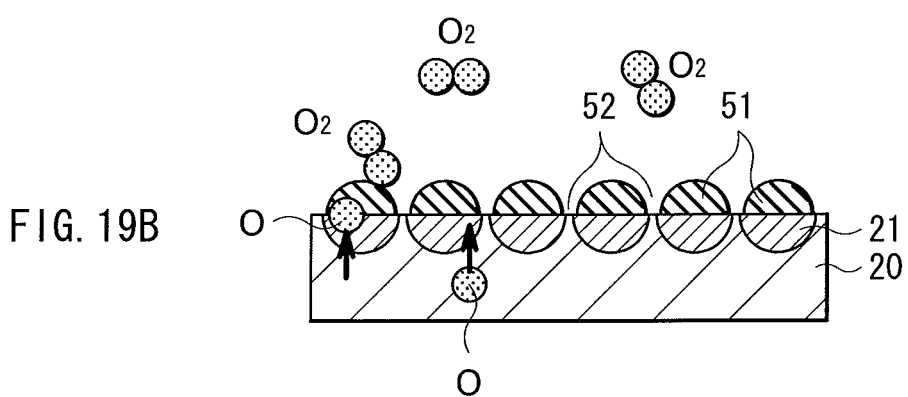

FIG. 19B schematically illustrates oxidation of the metal film 50A in an enlarged fashion. The plurality of island-shaped metal films 51A of the metal film 50A absorb oxygen O2 in an atmosphere and oxygen O within the oxide semiconductor film 20 serving as an underlying layer, and are thereby oxidized. Herein, each of the island-shaped metal films 51A increases in volume in accordance with an amount of oxygen absorbed. Also, a surface area, which contacts with oxygen, of the metal film 50A configured of the plurality of island-shaped metal films 51A increases. Hence, the oxidation is further promoted, making it possible to suppress the leakage current also from this respect. On the other hand, in the oxide semiconductor film 20, the low-resistance region 21 is formed immediately below each of the island-like metal films 51A.

Figure 19C:
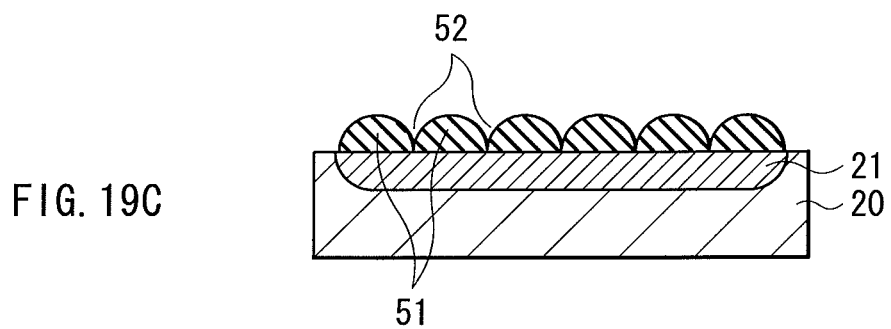

FIG. 19C schematically illustrates, in an enlarged fashion, that the high-resistance film 50 configured of the plurality of island-shaped high-resistance films 51 is formed, and that the low-resistance region 21 is formed in the oxide semiconductor film 20, by the oxidation of the metal film 50A. The island-shaped high-resistance film 51 expands by the oxidation, whereas the clearance gap 52 shrinks. Hence, among the island-shaped high-resistance films 51, there may be the island-shaped high-resistance film 51 which is separated from the adjacent island-shaped high-resistance film 51 by the clearance gap 52, and there may also be the island-shaped high-resistance film 51 which is joined to the adjacent island-shaped high-resistance film 51 by disappearance of the clearance gap 52.

As illustrated in FIG. 18C, after forming the low-resistance region 21, the interlayer insulating film 60 is formed on the high-resistance film 50 in a similar manner as in the first embodiment. Then, as illustrated in FIG. 14, the connection holes are formed in the interlayer insulating film 60 with photolithography and etching processes, for example.

Then, a film, which can be a molybdenum (Mo) film or other suitable film, is formed at a thickness of about 200 nm on the interlayer insulating film 60 with a sputtering method, for example, and photolithography and etching processes are performed to shape the same into a predetermined shape. Thereby, the source electrode 70S and the drain electrode 70D are connected to the low-resistance regions 21 as again illustrated in FIG. 14.

Figure 19D:
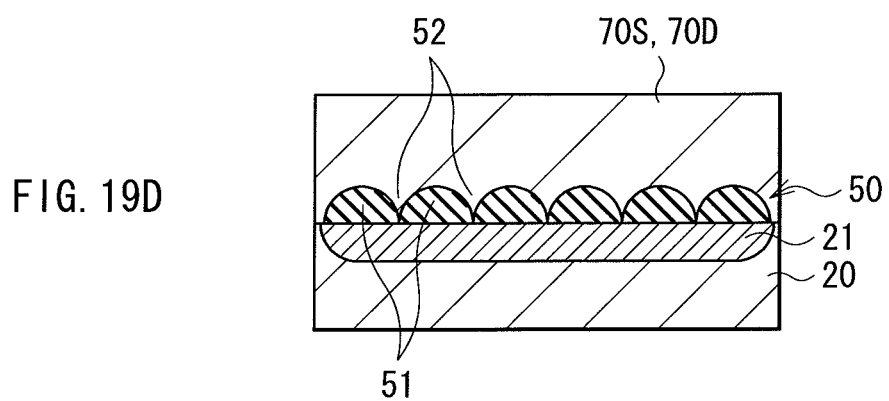

FIG. 19D illustrates a state where the source electrode 70S and the drain electrode 70D are formed on the plurality of island-shaped high-resistance films 51. The plurality of island-shaped high-resistance films 51 are separated from one another by the clearance gaps 52, so that the source electrode 70S and the drain electrode 70D are connected to the low-resistance regions 21 through the clearance gaps 52. Hence, a contact resistance between the source electrode 70S and the low-resistance region 21, and that between the drain electrode 70D and the low-resistance region 21, are decreased, thereby making it possible to eliminate a process step of removing the island-shaped high-resistance films 51 on the low-resistance region 21. Thus, the thin-film transistor 1D illustrated in FIG. 14 is completed.

In this thin-film transistor 1D, the current (the drain current) is generated in the channel region 20A of the oxide semiconductor film 20 when the voltage (the gate voltage), which is equal to or higher than a predetermined threshold voltage, is applied to the gate electrode 40, as in the first embodiment. Herein, the high-resistance film 50 is configured by the plurality of discontinuous island-shaped high-resistance films 51, and the adjacent island-shaped high-resistance films 51 are physically separated from each other by the clearance gap 52. Hence, electricity hardly flows among the island-shaped high-resistance films 51. Thus, the leakage current from the gate electrode 40 to the source electrode 70S or from the gate electrode 40 to the drain electrode 70D is blocked, making it possible to improve transistor characteristics.

Figure 21A:
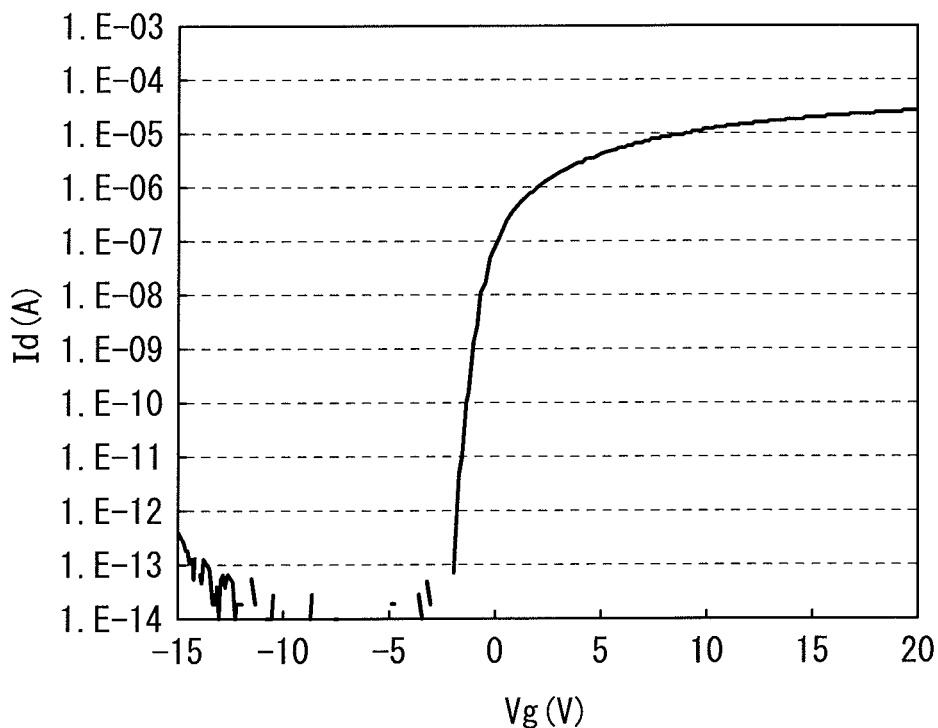
FIGS. 21A and 21B are diagrams comparing characteristics of the thin-film transistor illustrated in FIG. 14 with those of an existing thin-film transistor.

FIG. 21A represents a result of examination on transistor characteristics of the actually-fabricated thin-film transistor 1D having the high-resistance film 50 configured of the plurality of island-shaped high-resistance films 51 with the manufacturing method described in the foregoing. Herein, a silicon dioxide (SiO2) film was first formed at a thickness of 200 nm as a buffer layer on the substrate 11, made of a glass substrate, with a plasma-enhanced chemical vapor deposition (PECVD) method. Then, the oxide semiconductor film 20 made of an InGaZnO film was formed at a thickness of 40 nm. Then, the metal film 50A made of an aluminum film was formed at a thickness of 5 nm. The metal film 50A was deposited under deposition conditions where the substrate temperature was about 100 degrees centigrade and the argon pressure was about 0.5 PA. T/Tm in this case equals to 0.15 since the melting point of aluminum is about 660 degrees centigrade. Because the argon pressure was low, it was likely that the deposition was achieved under a state of "ZONE T (transition)" in the Thornton's model represented in FIG. 20. However, examination on a cross-section of the deposited metal film 50A confirmed that the plurality of discontinuous island-shaped metal films 51A were formed. Incidentally, it may be considered that a slight increase in the argon pressure may allow the deposition to be achieved under the state of "ZONE 1", and that the thickness of the metal film 50A can be made thick. Then, the heat treatment was performed on the metal film 50A at 300 degrees centigrade under an atmosphere containing about 30% of oxygen for one hour, to form the low-resistance region 21.

Figure 21B:
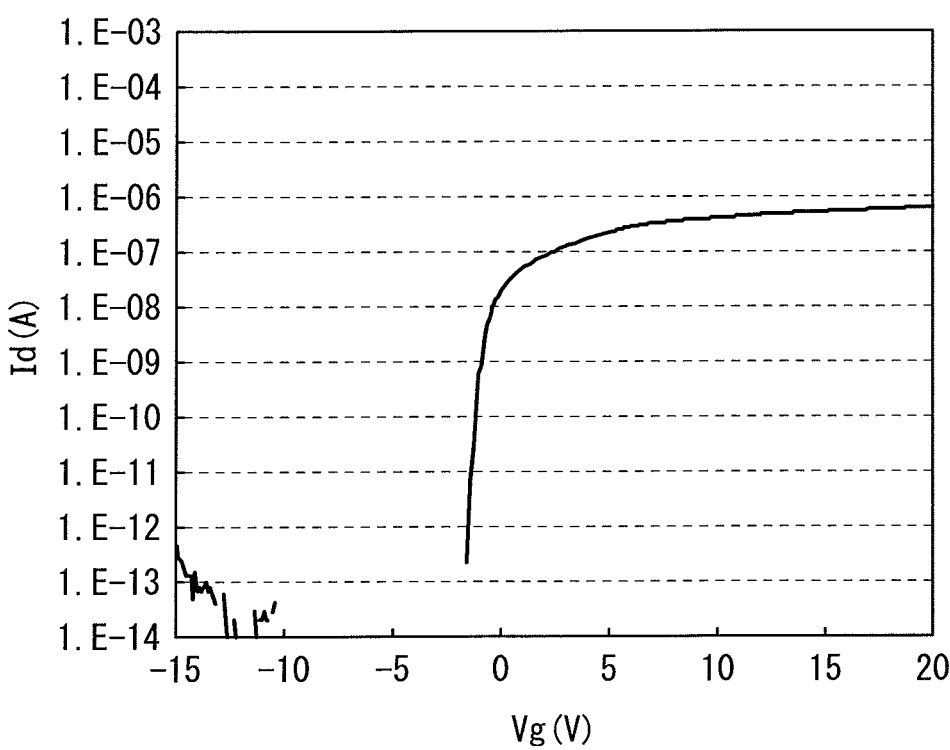

Meanwhile, another thin-film transistor was fabricated without performing the formation and the heat treatment of the metal film to examine transistor characteristics thereof, a result of which is represented in FIG. 21B.

As can be seen from FIGS. 21A and 21B, an ON-current of a transistor was increased by two digits or more in the thin-film transistor 1D, in which the low-resistance region 21 was formed and in which the high-resistance film 50 configured of the plurality of island-shaped high-resistance films 51 was formed by the heat treatment of the metal film 50A configured of the plurality of island-shaped metal films 51A, as compared with the thin-film transistor in which the formation and the heat treatment of the metal film were not conducted. In other words, the examinations indicated that it is possible to achieve the thin-film transistor 1D having a reduced parasitic capacitance by a self-aligned structure and having stabilized element characteristics as in the first embodiment, even with the thin-film transistor 1D in which the high-resistance film 50 is configured of the plurality of island-shaped high-resistance films 51.

Figure 22A:
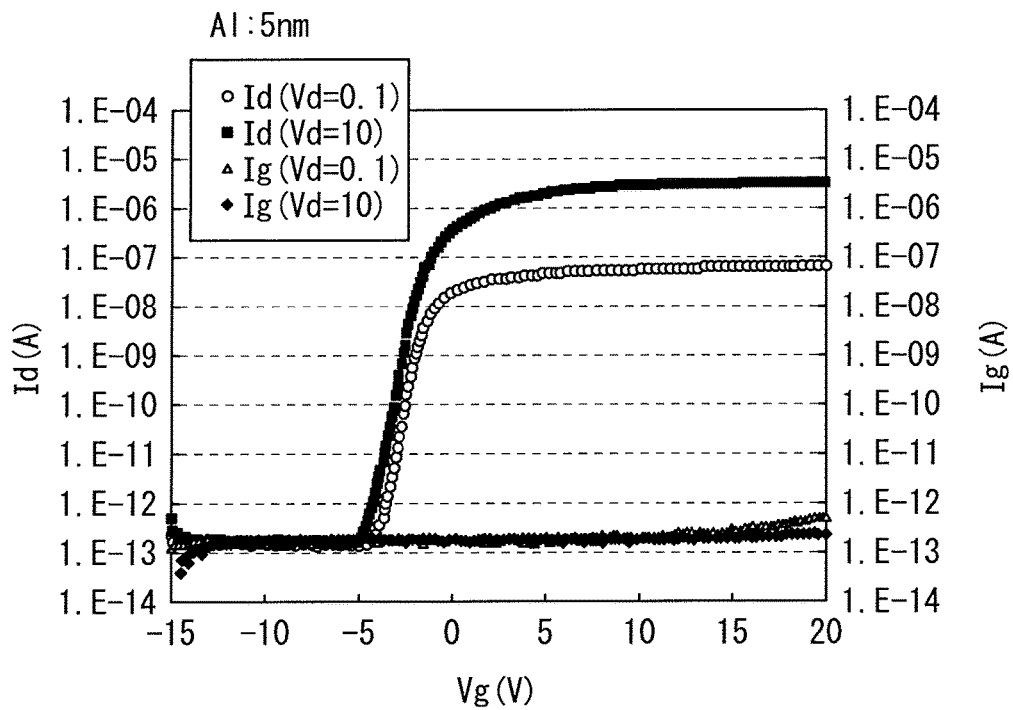
FIGS. 22A and 22B are diagrams each representing characteristics of a thin-film transistor when a thickness of a high-resistance film is varied.
Figure 22B:
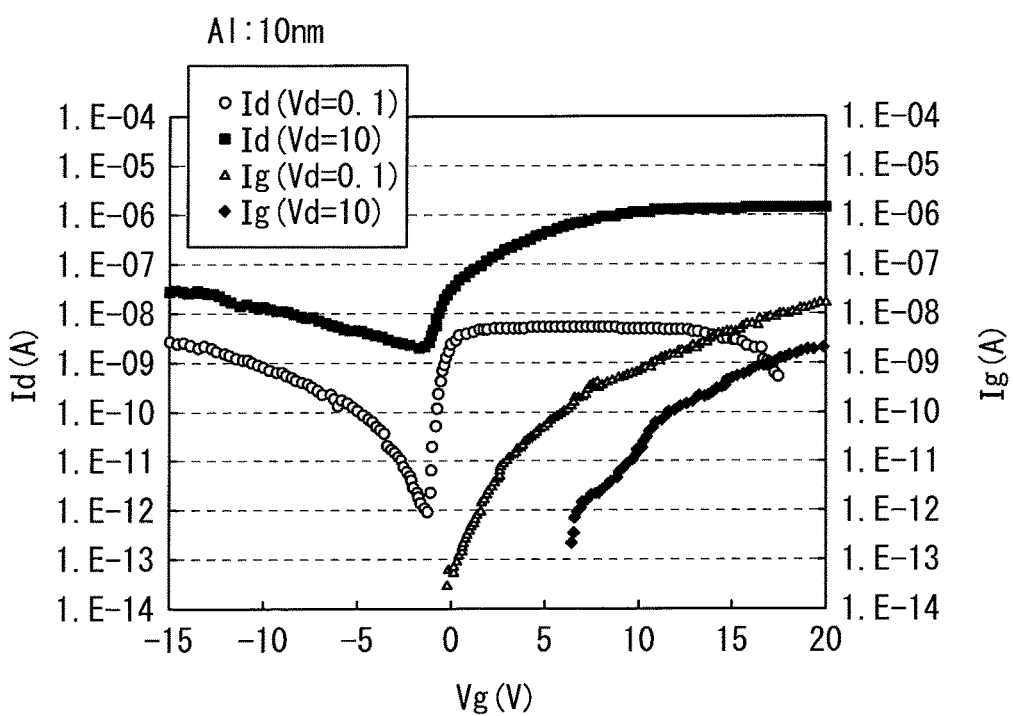

FIGS. 22A and 22B each represent a result of examination on a source-drain current Id and a gate-drain current Ig of the thin-film transistor 1D, in which examinations the thin-film transistors 1D, each having the high-resistance film 50 of different thickness by varying the thickness of the metal film 50A at 5 nm or 10 nm, were fabricated. As can be seen from FIGS. 22A and 22B, an OFF-state current of a transistor is large in the thin-film transistor 1D having the 10 nm thick metal film 50A as compared with the thin-film transistor 1D having the 5 nm thick metal film 50A, suggesting that there was a connection between the source electrode 70S and the drain electrode 70D. Also, in the thin-film transistor 1D having the 10 nm thick metal film 50A, leakage currents denoted by Ig are significantly large, meaning that the high-resistance film 50 obviously served as a leakage path.

In other words, it was found that forming the metal film 50A at the thickness of 5 nm or less reduces the leakage and allows the transistor characteristics to be improved.

According to the fourth embodiment, the high-resistance film 50 is configured by the plurality of island-shaped high-resistance films 51. Hence, it is possible to achieve effects of reducing the leakage current and improving the transistor characteristics, in addition to the effects achieved in the first embodiment. Also, the contact resistance between the source electrode 70S and the low-resistance region 21, and that between the drain electrode 70D and the low-resistance region 21 are decreased, thereby eliminating the process step of removing the island-shaped high-resistance films 51 on the low-resistance region 21. Hence, it is possible to simplify the manufacturing process.

Third Modification

FIGS. 23A to 24B illustrate a manufacturing method of the thin-film transistor 1D according to a third modification in order of process steps. The manufacturing method according to this modification differs from that according to the fourth embodiment described above in a formation method of the high-resistance film 50. Note that reference is made to FIGS. 2A to 2C to describe process steps that correspond to those in the first embodiment.

First, the oxide semiconductor film 20 is formed with the process step illustrated in FIG. 2A in a similar manner as in the first embodiment. Then, the gate insulating film 30 and the gate electrode 40 are formed in this order and in the same shape on the channel region 20A of the oxide semiconductor film 20 with the process steps illustrated in FIGS. 2B and 2C in a similar manner as in the first embodiment.

Figure 23A:
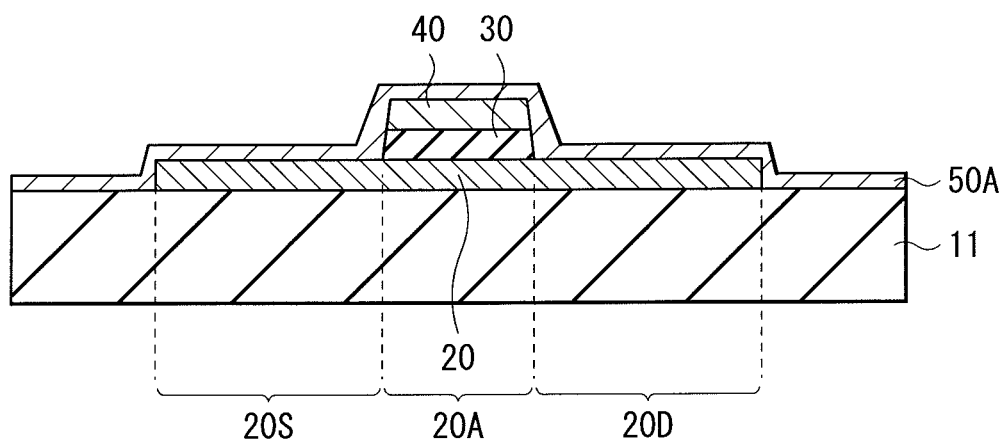
FIGS. 23A and 23B are cross-sectional views illustrating a manufacturing method of a thin-film transistor according to a third modification in order of process steps.

Then, as illustrated in FIG. 23A, the metal film 50A configured of aluminum (Al) is formed as an uniform continuous film on the surfaces of the oxide semiconductor film 20, the gate insulating film 30, and the gate electrode 40.

Figure 23B:
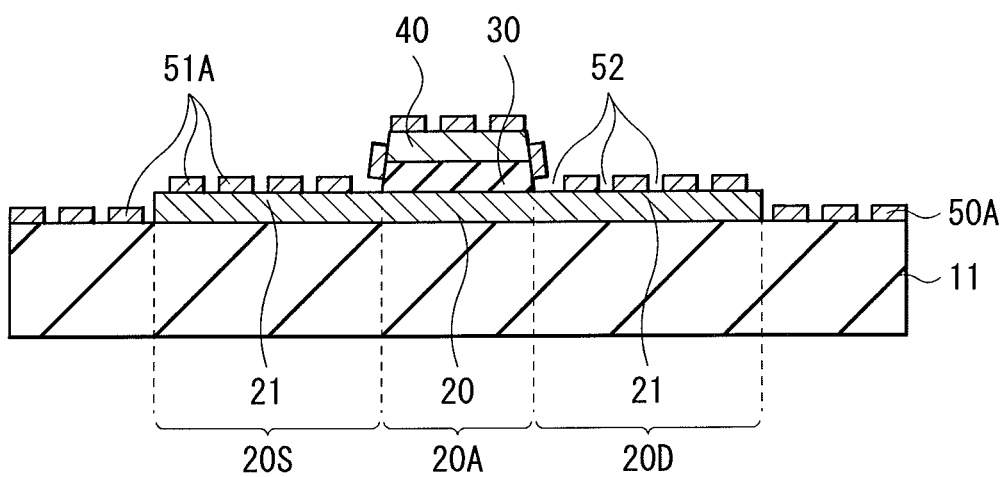

Then, as illustrated in FIG. 23B, the metal film 50A is patterned with photolithography and etching processes, for example, to divide the metal film 50A into the plurality of island-shaped metal films 51A. The clearance gaps 52 are provided among the plurality of island-shaped metal films 51A, and these clearance gaps 52 are utilized to physically separate the plurality of island-shaped metal films 51A from one another.

Figure 24A:
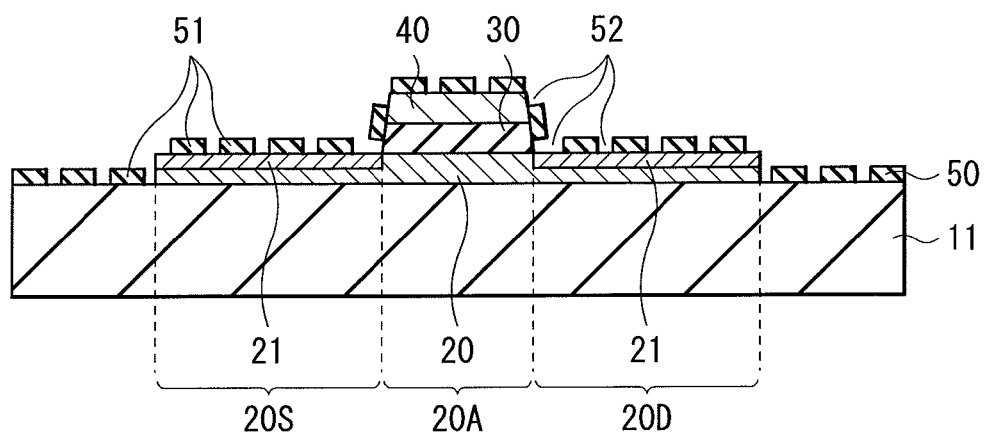
FIGS. 24A and 24B are cross-sectional views illustrating process steps subsequent to those of FIGS. 23A and 23B.

As illustrated in FIG. 24A, after forming the plurality of island-shaped metal films 51A, the heat treatment is performed in a similar manner as in the first embodiment to oxidize the plurality of island-shaped metal films 51A of the metal film 50A, by which the high-resistance film 50 having the plurality of island-shaped high-resistance film 51 configured of aluminum oxide is formed. This in turn results in the formation of the low-resistance region 21, which includes aluminum as a dopant, or which has the lower oxygen concentration than that of the channel region 20A, in a part of each of the source region 20S and the drain region 20D extending in the depth direction from the upper face thereof.

Figure 24B:
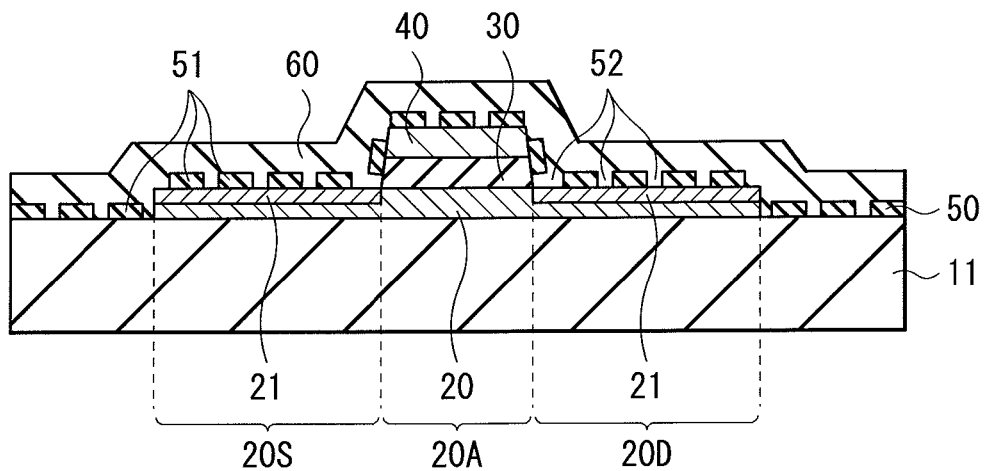

As illustrated in FIG. 24B, after forming the low-resistance region 21, the interlayer insulating film 60 is formed on the high-resistance film 50 in a similar manner as in the first embodiment. Then, as illustrated in FIG. 14, the connection holes are formed in the interlayer insulating film 60 with photolithography and etching processes, for example.

Then, a film, which can be a molybdenum (Mo) film or other suitable film, is formed at a thickness of about 200 nm on the interlayer insulating film 60 with a sputtering method, for example, and photolithography and etching processes are performed to shape the same into a predetermined shape. Thereby, the source electrode 70S and the drain electrode 70D are connected to the low-resistance regions 21 as again illustrated in FIG. 14. The plurality of island-shaped high-resistance films 51 are separated from one another by the clearance gaps 52, so that the source electrode 70S and the drain electrode 70D are connected to the low-resistance regions 21 through the clearance gaps 52. Hence, the contact resistance between the source electrode 70S and the low-resistance region 21, and that between the drain electrode 70D and the low-resistance region 21, are decreased, thereby making it possible to eliminate the process step of removing the island-shaped high-resistance films 51 on the low-resistance region 21. Thus, the thin-film transistor 1D illustrated in FIG. 14 is completed.

Fourth Modification

FIGS. 25A to 26B illustrate a manufacturing method of the thin-film transistor 1D according to a fourth modification in order of process steps. The manufacturing method according to this modification differs from that according to the fourth embodiment described above in a formation method of the high-resistance film 50. Note that reference is made to FIGS. 2A to 2C to describe process steps that correspond to those in the first embodiment.

First, the oxide semiconductor film 20 is formed with the process step illustrated in FIG. 2A in a similar manner as in the first embodiment. Then, the gate insulating film 30 and the gate electrode 40 are formed in this order and in the same shape on the channel region 20A of the oxide semiconductor film 20 with the process steps illustrated in FIGS. 2B and 2C in a similar manner as in the first embodiment.

Figure 25A:
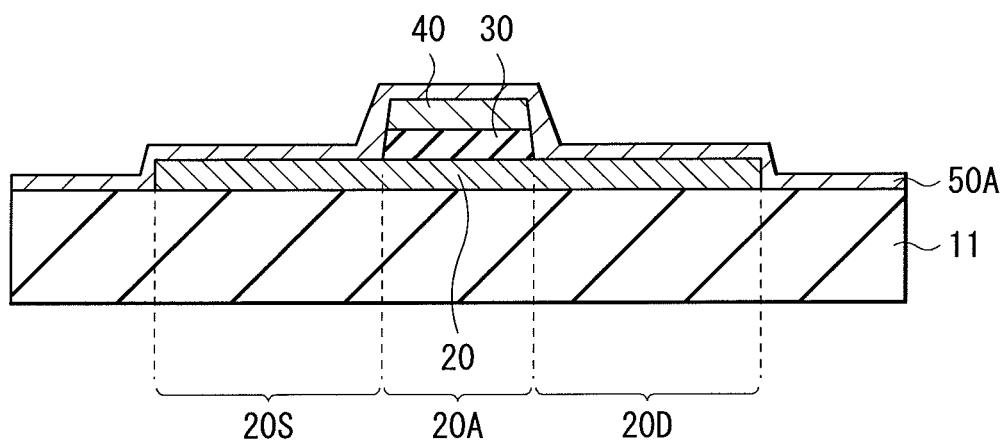
FIGS. 25A and 25B are cross-sectional views illustrating a manufacturing method of a thin-film transistor according to a fourth modification in order of process steps.

Then, as illustrated in FIG. 25A, the metal film 50A configured of aluminum (Al) is formed as the uniform continuous film on the surfaces of the oxide semiconductor film 20, the gate insulating film 30, and the gate electrode 40.

Figure 25B:
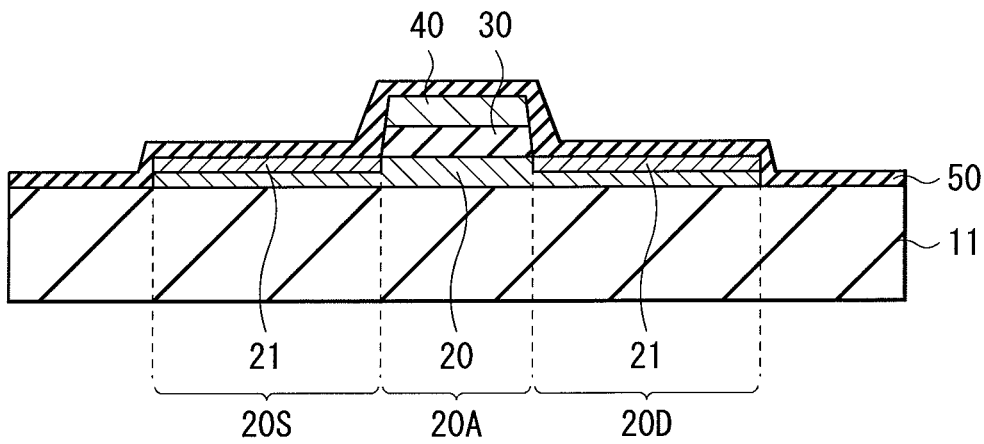

Then, as illustrated in FIG. 25B, the heat treatment is performed in a similar manner as in the first embodiment to oxidize the metal film 50A so as to form the high-resistance film 50. This in turn results in the formation of the low-resistance region 21, which includes aluminum as a dopant, or which has the lower oxygen concentration than that of the channel region 20A, in a part of each of the source region 20S and the drain region 20D extending in the depth direction from the upper face thereof.

Figure 26A:
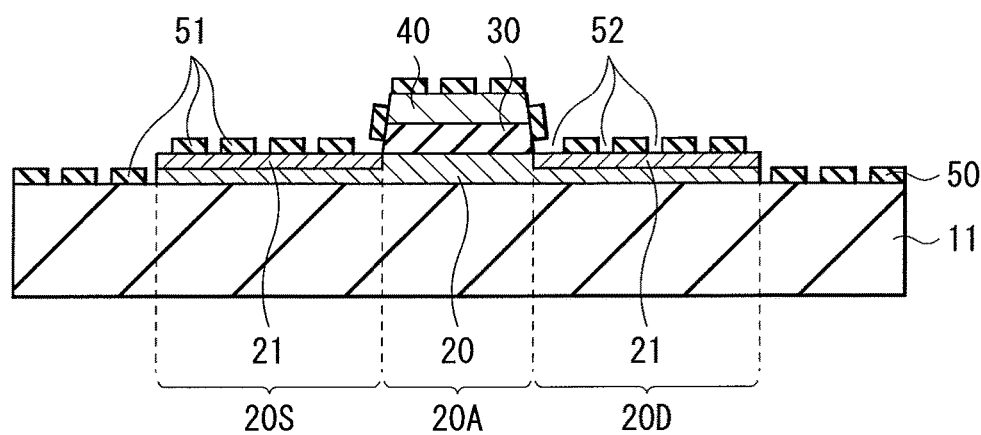
FIGS. 26A and 26B are cross-sectional views illustrating process steps subsequent to those of FIGS. 25A and 25B.

Then, as illustrated in FIG. 26A, the high-resistance film 50 is patterned with photolithography and etching processes, for example, to divide the high-resistance film 50 into the plurality of island-shaped high-resistance films 51. The clearance gaps 52 are provided among the plurality of island-shaped high-resistance films 51, and these clearance gaps 52 are utilized to physically separate the plurality of island-shaped high-resistance films 51 from one another.

Figure 26B:
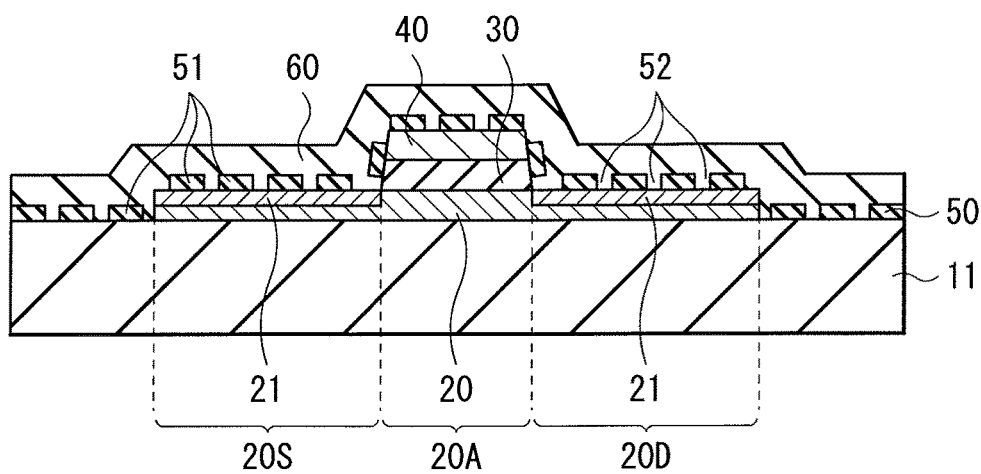

As illustrated in FIG. 26B, after forming the plurality of island-shaped high-resistance films 51, the interlayer insulating film 60 is formed on the high-resistance film 50 in a similar manner as in the first embodiment. Then, as illustrated in FIG. 14, the connection holes are formed in the interlayer insulating film 60 with photolithography and etching processes, for example.

Then, a film, which can be a molybdenum (Mo) film or other suitable film, is formed at a thickness of about 200 nm on the interlayer insulating film 60 with a sputtering method, for example, and photolithography and etching processes are performed to shape the same into a predetermined shape. Thereby, the source electrode 70S and the drain electrode 70D are connected to the low-resistance regions 21 as again illustrated in FIG. 14. The plurality of island-shaped high-resistance films 51 are separated from one another by the clearance gaps 52, so that the source electrode 70S and the drain electrode 70D are connected to the low-resistance regions 21 through the clearance gaps 52. Hence, the contact resistance between the source electrode 70S and the low-resistance region 21, and that between the drain electrode 70D and the low-resistance region 21, are decreased, thereby making it possible to eliminate the process step of removing the island-shaped high-resistance films 51 on the low-resistance region 21. Thus, the thin-film transistor 1D illustrated in FIG. 14 is completed.

Fifth Embodiment

Figure 27:
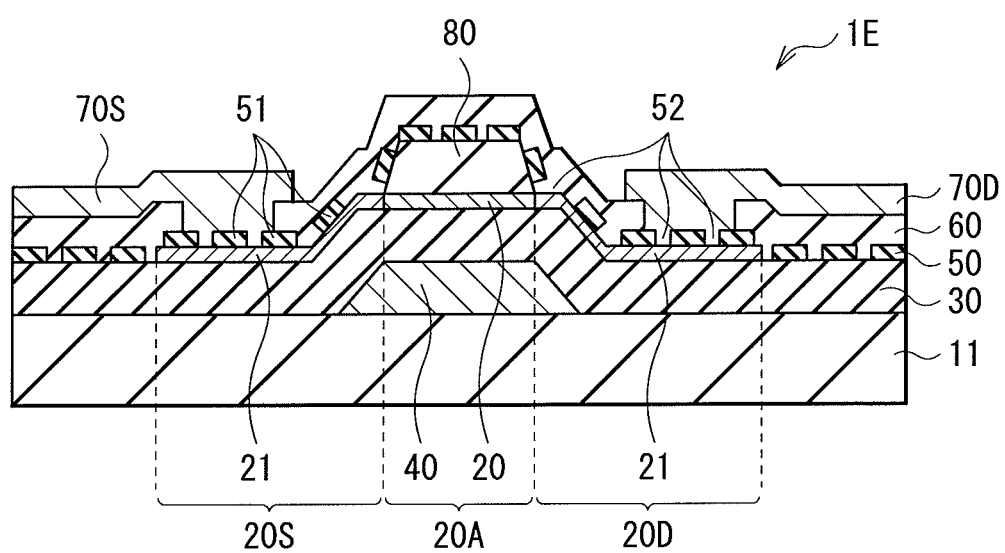
FIG. 27 is a cross-sectional view illustrating a configuration of a thin-film transistor according to a fourth embodiment.

FIG. 27 illustrates a cross-sectional configuration of a thin-film transistor 1E according to a fifth embodiment. The thin-film transistor 1E has a similar configuration as that of each of the thin-film transistors 1B and 1D according to the third and the fourth embodiments described above, except that the thin-film transistor 1E is a bottom-gate thin-film transistor in which the gate electrode 40, the gate insulating film 30, the oxide semiconductor film 20, the channel protecting film 80, the interlayer insulating film 60, the source electrode 70S, and the drain electrode 70D are stacked in this order on the substrate 11. Note that the same or equivalent elements as those according to the third and the fourth embodiments are denoted with the same reference numerals, and will not be described in detail.

The thin-film transistor 1E may be manufactured, for example, as follows. Note that reference is made to the first embodiment or the third embodiment to describe process steps that are same as those in the first embodiment or the third embodiment.

Figure 28A:
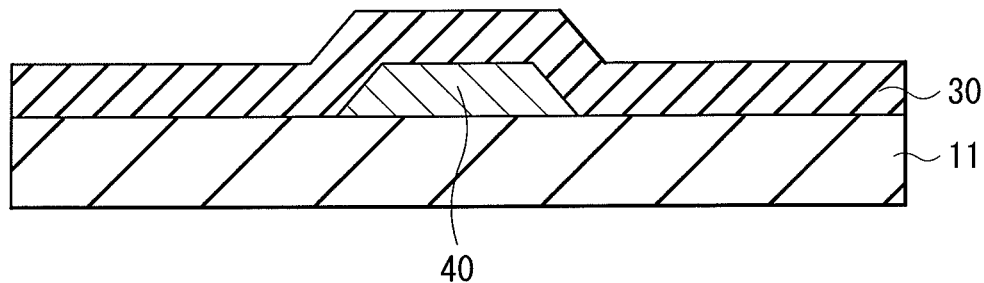
FIGS. 28A to 28D are cross-sectional views illustrating a manufacturing method of the thin-film transistor illustrated in FIG. 27 in order of process steps.

First, as illustrated in FIG. 28A, the gate electrode 40 and the gate insulating film 30 are formed in order on the substrate 11 with the process step illustrated in FIG. 10A in a similar manner as in the third embodiment.

Figure 28B:
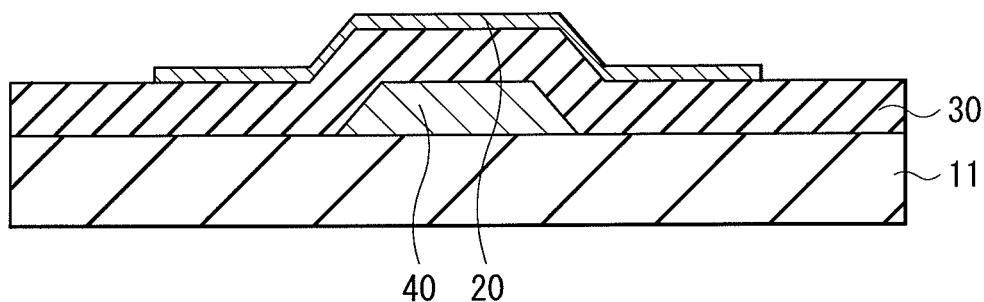

Then, as illustrated in FIG. 28B, the oxide semiconductor film 20 is formed on the gate insulating film 30 with the process step illustrated in FIG. 10B in a similar manner as in the third embodiment.

Figure 28C:
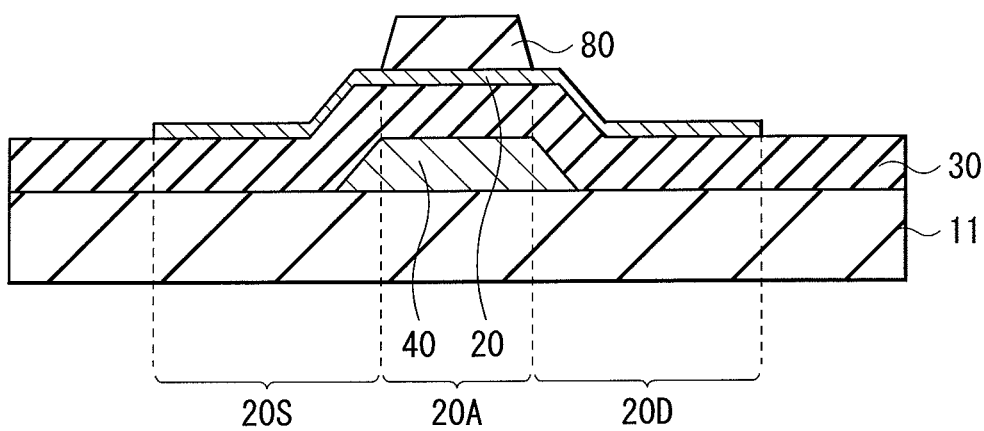

Then, as illustrated in FIG. 28C, the channel protecting film 80 is formed on the oxide semiconductor film 20 with the process step illustrated in FIG. 10C in a similar manner as in the third embodiment.

Figure 28D:
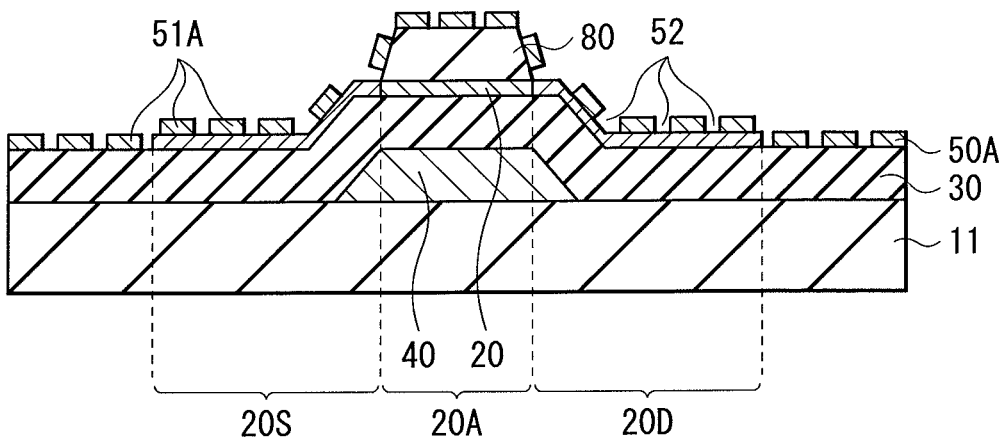

Then, as illustrated in FIG. 28D, the metal film 50A configured of the plurality of island-shaped metal films 51A is formed on the oxide semiconductor film 20, the channel protecting film 80, and the gate insulating film 30 with the process step illustrated in FIG. 18A in a similar manner as in the fourth embodiment.

Figure 29A:
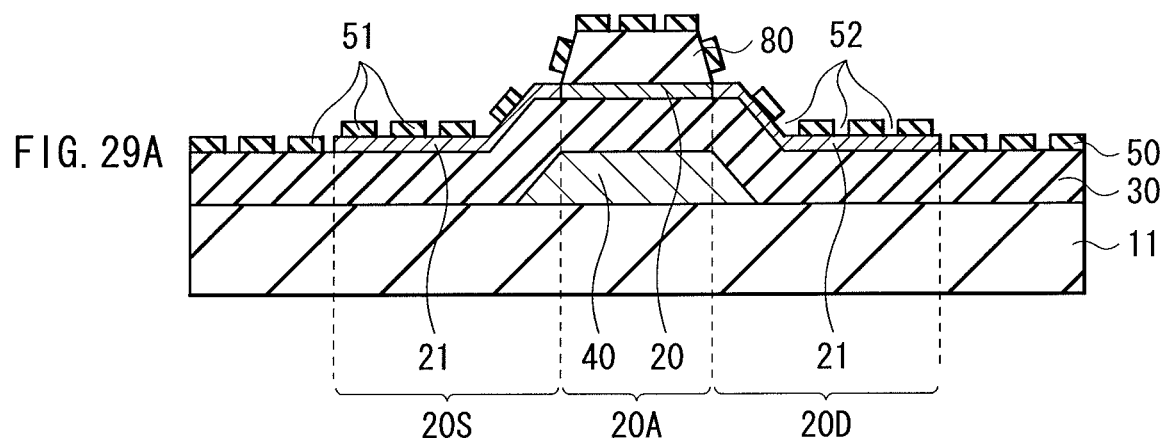
FIGS. 29A to 29C are cross-sectional views illustrating process steps subsequent to those of FIGS. 28A to 28D.

Then, as illustrated in FIG. 29A, the heat treatment is performed in a similar manner as in the fourth embodiment to oxidize the plurality of island-shaped metal films 51A of the metal film 50A with the process step illustrated in FIG. 18B so as to form the high-resistance film 50 configured of the plurality of island-shaped high-resistance films 51. This in turn results in the formation of the low-resistance region 21, having the lower oxygen concentration than that of the channel region 20A, in a part or in the entire part of each of the source region 20S and the drain region 20D extending in the depth direction from the upper face thereof.

Figure 29B:
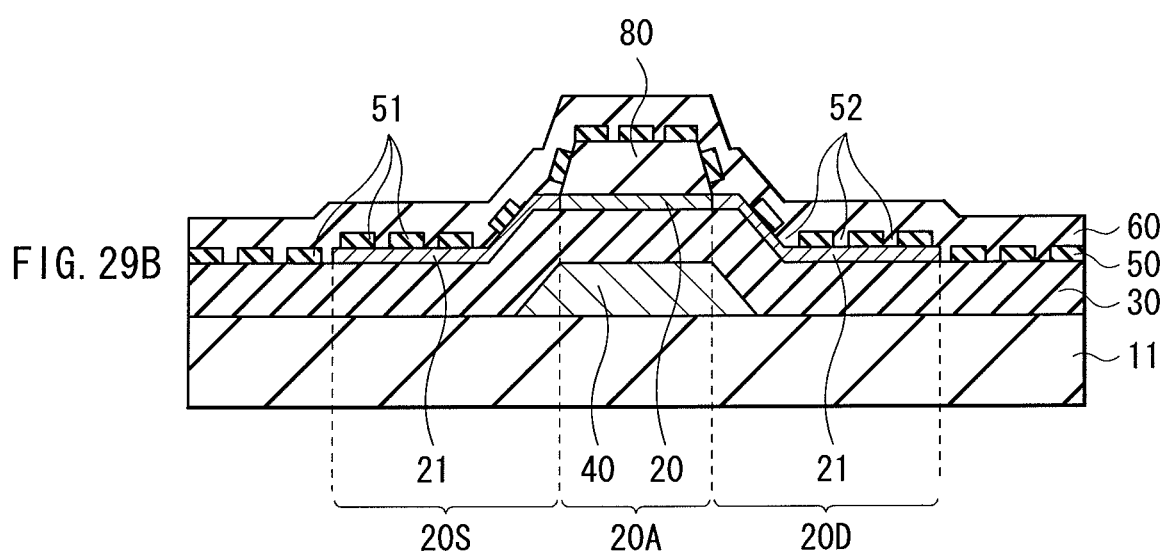

As illustrated in FIG. 29B, after forming the low-resistance region 21 and the high-resistance film 50, the interlayer insulating film 60 is formed on the high-resistance film 50 in a similar manner as in the first embodiment.

Figure 29C:
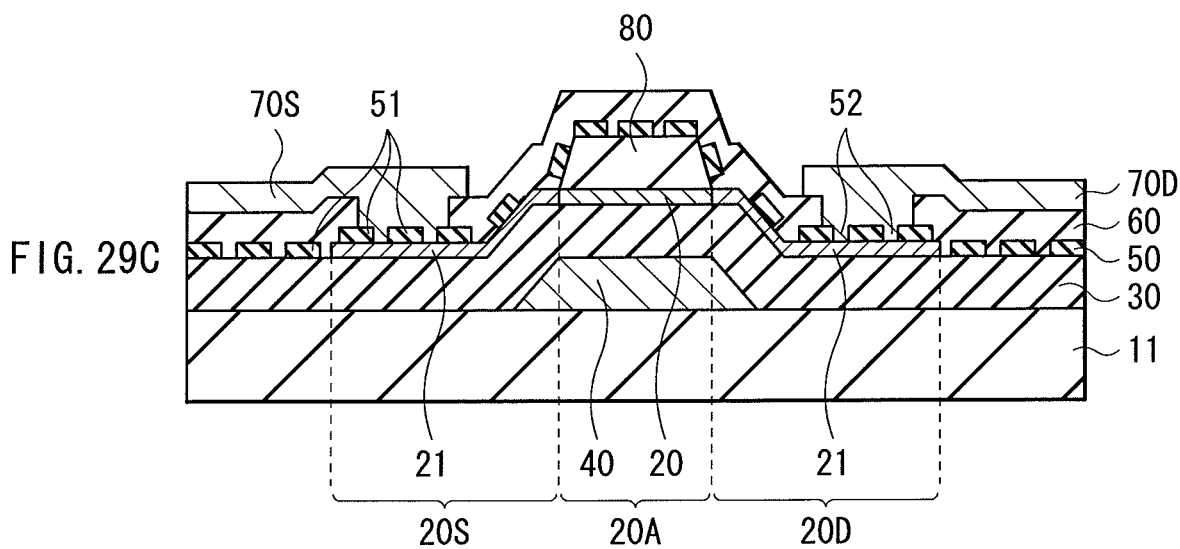

As illustrated in FIG. 29C, after forming the interlayer insulating film 60, the connection holes are provided in the interlayer insulating film 60, and the source electrode 70S and the drain electrode 70D are connected to the low-resistance regions 21, in a similar manner as in the first embodiment. Thus, the thin-film transistor 1E illustrated in FIG. 27 is completed.

First Application Example

Figure 30:
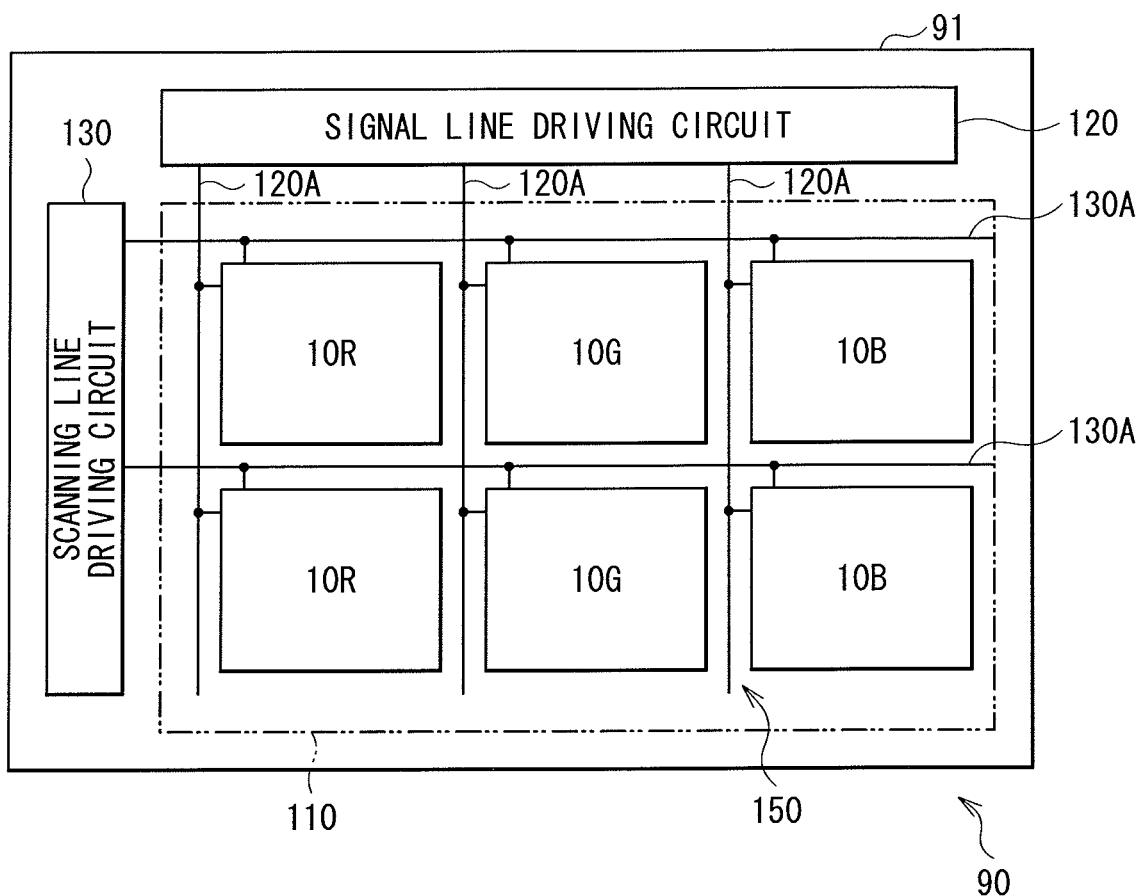
FIG. 30 illustrates a configuration of a circuit of a display device according to a first application example.

FIG. 30 illustrates a configuration of a circuit of a display device 90 provided with any one of the thin-film transistors 1 to 1E as a drive element. The display device 90 may be a display such as a liquid crystal display and an organic EL display, for example. The display device 90 is provided, on a drive panel 91, with a plurality of pixels 10R, 10G, and 10B which are arranged in matrix, and various driving circuits for driving those pixels 10R, 10G, and 10B. The pixels 10R, 10G, and 10B may be elements, such as liquid crystal display elements and organic EL elements, which emit lights for red, green, and blue, respectively, although the number of colors and the types of colors are not limited thereto. These three pixels 10R, 10G, and 10B are grouped as a single pixel to configure a displaying region 110 having a plurality of such pixels. Above the drive panel 91 are a signal line driving circuit 120 and a scanning line driving circuit 130 each serving as a driver for image displaying, and a pixel driving circuit 150, which are provided as the driving circuits, for example. An unillustrated sealing panel is attached to the drive panel 91, by which sealing panel the pixels 10R, 10G, and 10B, and the driving circuits are sealed.

Figure 31:
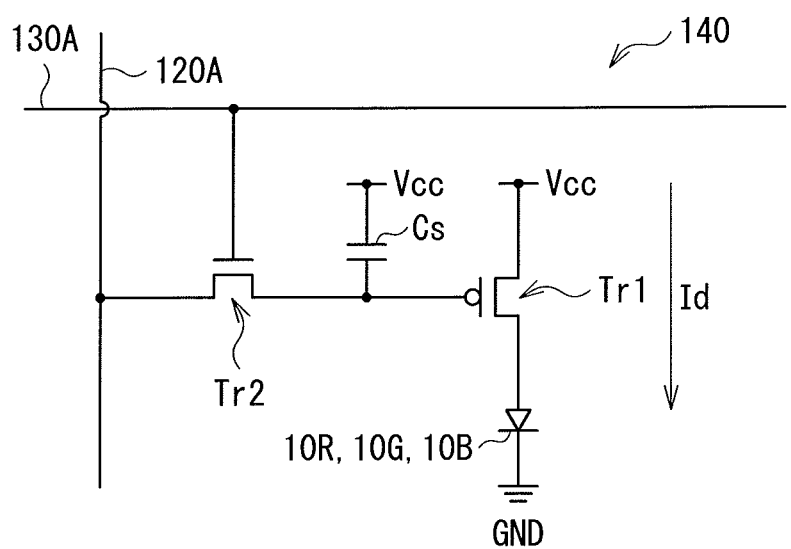
FIG. 31 is an equivalent circuit diagram illustrating an example of a pixel driving circuit illustrated in FIG. 30.

FIG. 31 is an equivalent circuit diagram of the pixel driving circuit 150. The pixel driving circuit 150 is an active-type driving circuit in which transistors Tr1 and Tr2 are arranged. Each of the transistors Tr1 and Tr2 is any one of the thin-film transistors 1 to 1E described above. A capacitor Cs is provided between the transistors Tr1 and Tr2. The pixel 10R (or the pixel 10G or 10B) is connected in series to the transistor Tr1 between a first power source line (Vcc) and a second power source line (GND). The pixel driving circuit 150 is further provided with a plurality of signal lines 120A arranged in columns, and a plurality of scanning lines 130A arranged in rows. Each of the signal lines 120A is connected to the signal line driving circuit 120, from which circuit image signals are supplied to source electrodes of the transistors Tr2 through the signal lines 120A. Each of the scanning lines 130A is connected to the scanning line driving circuit 130, from which circuit scanning signals are sequentially supplied to gate electrodes of the transistors Tr2 through the scanning lines 130A. In the display device 90, each of the transistors Tr1 and Tr2 is configured by any one of the thin-film transistors 1 to 1E according to the embodiments and the modifications. Hence, it is possible to perform high-quality displaying by any one of the thin-film transistors 1 to 1E having a reduced parasitic capacitance by a self-aligned structure and having stabilized characteristics. Such a display device 90 may be employed in any electronic devices, such as those according to second to sixth application examples as follows, for example.

Second Application Example

Figure 32:
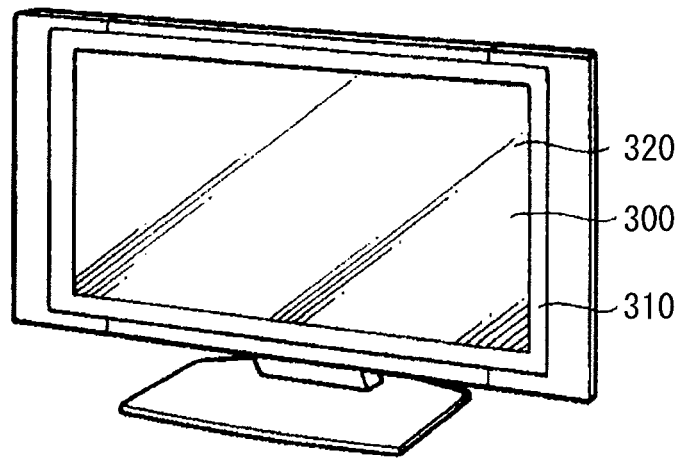
FIG. 32 is a perspective view illustrating an external appearance of a second application example.

FIG. 32 illustrates an external appearance of a television device. The television device is provided with an image display screen unit 300 including a front panel 310 and a filter glass 320, for example.

Third Application Example

Figure 33A:
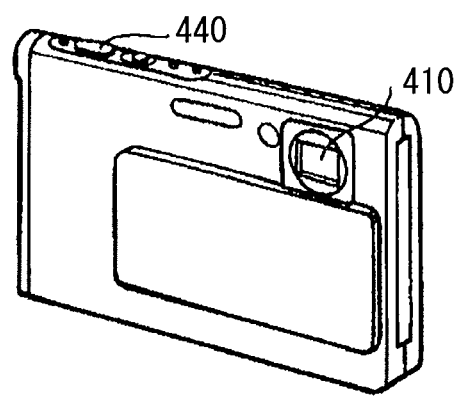
FIG. 33A is a perspective view illustrating an external appearance of a third application example as viewed from a front side thereof.
Figure 33B:
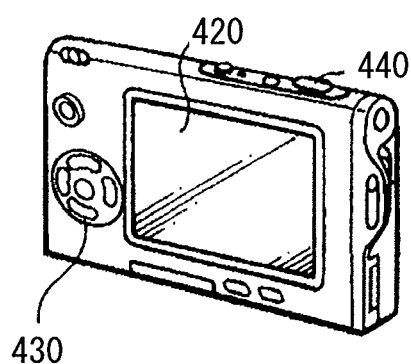
FIG. 33B is a perspective view illustrating the external appearance of the third application example as viewed from a back side thereof.

FIGS. 33A and 33B each illustrate an external appearance of a digital camera. The digital camera is provided with a light emitting unit 410 for flash, a display unit 420, a menu switch section 430, and a shutter-release button 440, for example.

Fourth Application Example

Figure 34:
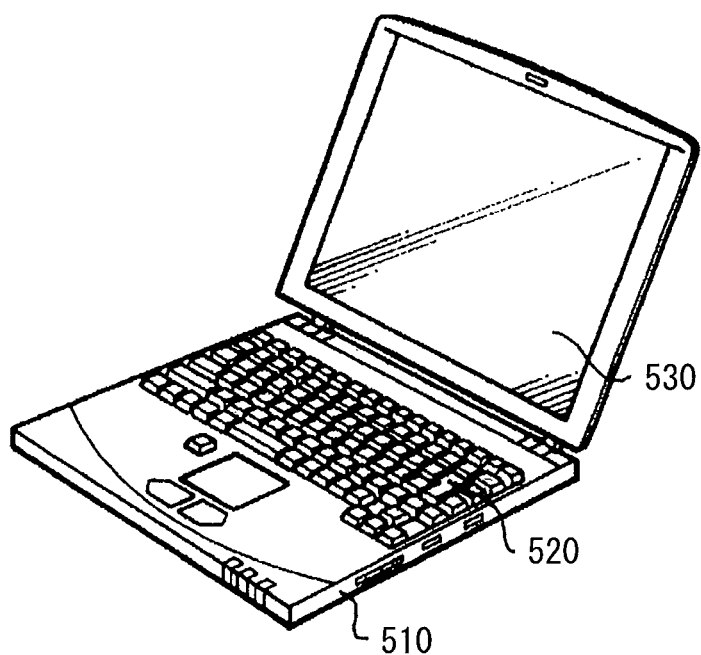
FIG. 34 is a perspective view illustrating an external appearance of a fourth application example.

FIG. 34 illustrates an external appearance of laptop personal computer. The laptop personal computer is provided with a body 510, a keyboard 520 for input-manipulation of characters and the like, and a display unit 530 for displaying an image, for example.

Fifth Application Example

Figure 35:
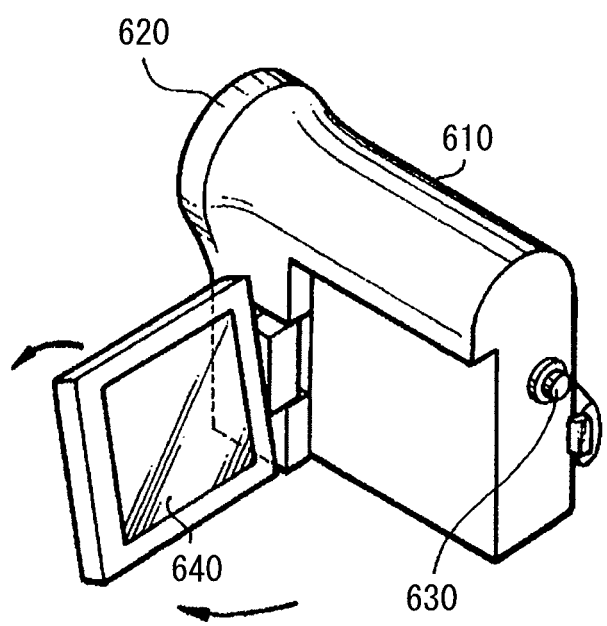
FIG. 35 is a perspective view illustrating an external appearance of a fifth application example.

FIG. 35 illustrates an external appearance of a video camera. The video camera is provided with a body 610, a lens 620 provided in a front face of the body 610 for picking-up an image of an object, a shooting start/stop switch 630, and a display unit 640, for example.

Sixth Application Example

FIGS. 36A to 36G each illustrate an external appearance of a cellular phone. The cellular phone couples an upper casing 710 and a lower casing 720 through a coupling part (or a hinge) 730, and is provided with a display 740, a sub-display 750, a picture light 760, and a camera 770, for example.

Figure 37:
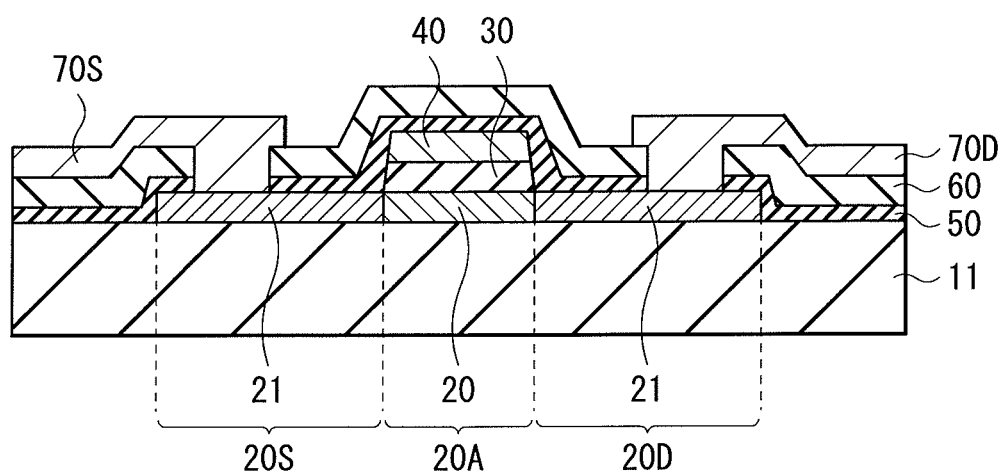
FIG. 37 is a cross-sectional view illustrating a modification of the thin-film transistor illustrated in FIG. 1.

Although the present application has been described in the foregoing by way of example with reference to the embodiments, the modifications, and the application examples, the present application is not limited thereto but may be modified in a wide variety of ways. For example, in the embodiments etc. described above, a part of each of the source region 20S and the drain region 20D extending in the depth direction from the upper face of each of the source region 20S and the drain region 20D is provided with the low-resistance region 21. However, the low-resistance region 21 may be provided in at least a part of each of the source region 20S and the drain region 20D extending in the depth direction from the upper face of each of the source region 20S and the drain region 20D. For example, as illustrated in FIG. 37, the low-resistance region 21 may be provided in the entire part of each of the source region 20S and the drain region 20D extending in the depth direction from the upper face of each of the source region 20S and the drain region 20D.

Also, in the embodiments etc. described above, the oxide semiconductor film 20 is provided directly on the substrate 11. However, the oxide semiconductor film 20 may be provided on the substrate 11 with an insulating film such as a silicon dioxide film, a silicon nitride film, and an aluminum oxide film in between. This makes it possible to suppress diffusion of an influential factor, such as impurity and moisture, from the substrate 11 into the oxide semiconductor film 20.

Further, in the embodiments etc. described above, materials and thicknesses of various layers, deposition methods, and deposition conditions are illustrative, and not limitative. Other materials, thicknesses, deposition methods, and deposition conditions may be employed.

Besides the liquid crystal display and the organic EL display, the present application is applicable to display devices utilizing other display elements, such as inorganic EL elements, electrodeposition-type display elements, and electrochromic-type display elements.

Although the present application has been described in terms of exemplary embodiments, etc., it is not limited thereto. It should be appreciated that variations may be made in the described embodiments etc. by persons skilled in the art without departing from the scope of the present application as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

The application is claimed as follows:

1. A thin film transistor comprising:
a gate electrode,
a gate insulating film,
an oxide semiconductor layer having an island-like shape including
a source region,
a drain region, and
a channel region, and
a high-resistance material layer that is provided on and directly contacts the source and drain regions,
wherein the gate electrode is provided between the gate insulating film and the high-resistance material layer and the gate electrode directly contacts with the gate insulating film and the high-resistance material layer,
wherein a portion of the source and drain regions includes a dopant selected from the group consisting of aluminum, boron, gallium, indium, titanium, silicon, germanium, tin, lead, and combinations thereof,
wherein a density of the dopant in the source and drain regions of the oxide semiconductor layer having the island-like shape is higher than the channel region of the oxide semiconductor layer having the island-like shape, and
wherein the thin film transistor is a top gate transistor.

2. The thin film transistor of claim 1, wherein the portion of the source and drain regions is a low-resistance region extending in a depth direction from an upper face thereof.

3. The thin film transistor of claim 2, wherein the low-resistance region extends at least within 30 nm in the depth direction from the upper face thereof.

4. The thin film transistor of claim 1, wherein the high-resistance material layer includes a constituent selected from the group consisting of titanium, aluminum, and indium, boron, gallium, silicon, germanium, tin, and lead.

5. The thin film transistor of claim 1, wherein the high-resistance material layer includes any one of a plurality of island-shaped metal films and a plurality of island-shaped nonmetal films.

6. The thin film transistor of claim 5, wherein any one of the island-shaped metal films and the island-shaped nonmetal films are spaced apart so as to provide a clearance gap.

7. The thin film transistor of claim 5, wherein the portion of the source and drain regions is a low-resistance region extending in a depth direction from an upper face thereof, and wherein a first portion of any one of the island-shaped metal films and the island-shaped nonmetal films is in contact with the low resistance region and a second portion of any one of the island-shaped metal films and the island-shaped nonmetal films is in contact with a gate electrode.

8. The thin film transistor of claim 1, further including an insulating layer.

9. The thin film transistor of claim 1 further including a source electrode and a drain electrode.

10. The thin film transistor of claim 1, wherein the density of the dopant in the source and drain region is equal to or higher than $1 \times 10^{19}/cm^3$.

11. The thin film transistor of claim 1, wherein the high-resistance material layer includes aluminum oxide, indium oxide or titanium oxide.

12. The thin film transistor of claim 1, wherein the high-resistance material layer is provided on and directly contacts a low-resistance region of the oxide semiconductor layer.

* * * * *